United States Patent
Koyanagi et al.

(10) Patent No.: US 8,242,812 B2
(45) Date of Patent: Aug. 14, 2012

(54) BUFFER CIRCUIT

(75) Inventors: Masaru Koyanagi, Tokyo (JP);
Fumiyoshi Matsuoka, Kawawsaki (JP);
Yasuhiro Suematsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 12/963,194

(22) Filed: Dec. 8, 2010

(65) Prior Publication Data

US 2011/0133792 A1 Jun. 9, 2011

(30) Foreign Application Priority Data

Dec. 9, 2009 (JP) ................................. 2009-279293

(51) Int. Cl.
*H03K 3/00* (2006.01)

(52) U.S. Cl. ........ 327/109; 327/170; 327/427; 327/436; 326/85; 326/87

(58) Field of Classification Search .................. 327/170, 327/108–112, 427, 430, 431, 434, 436; 326/82, 326/83, 85–87
See application file for complete search history.

(56) References Cited

U.S. PATENT DOCUMENTS

| 5,422,588 A | * | 6/1995 | Wynne ......................... 327/437 |
| 5,949,254 A | | 9/1999 | Keeth |
| 5,952,869 A | * | 9/1999 | Fattori et al. .................. 327/404 |
| 6,577,551 B2 | | 6/2003 | Ito et al. |
| 7,359,255 B2 | | 4/2008 | Kimura et al. |

FOREIGN PATENT DOCUMENTS

| JP | 2001-506821 | 5/2001 |
| JP | 2009-134349 | 6/2009 |

* cited by examiner

*Primary Examiner* — An Luu
(74) *Attorney, Agent, or Firm* — Oblon, Spivak, McClelland, Maier & Neustadt, L.L.P.

(57) ABSTRACT

A buffer circuit in accordance with an embodiment comprises output transistors connected between a first fixed voltage terminal and an output terminal, and gate control transistors connected between a second fixed voltage terminal and a gate of one of the output transistors or between two of gates of the output transistors. The output transistors are configured to turn on to change a voltage of the output terminal. The gate control transistors are configured to apply a gate voltage to the gates of the output transistors. A gate of each of the gate control transistors is applied with a certain voltage, such that when a source of each of the gate control transistors changes from a first potential to a second potential, a potential difference between the gate and the source attains a threshold voltage or greater, whereby each of the gate control transistors is turned on.

20 Claims, 40 Drawing Sheets

Without Terminating Resistor

With Terminating Resistor

BUFFER CIRCUIT

CROSS REFERENCE TO RELATED APPLICATION

This application is based upon and claims the benefit of priority from prior Japanese Patent Application No. 2009-279293, filed on Dec. 9, 2009, the entire contents of which are incorporated herein by reference.

BACKGROUND

1. Field

Embodiments described in this specification relate to a buffer circuit disposed between an input/output pad and various kinds of circuits in a semiconductor integrated circuit.

2. Description of the Related Art

A semiconductor integrated circuit has a buffer circuit disposed between an input/output pad and various kinds of circuits. In a NAND cell type flash memory or the like, when a non-output-terminating interface specification is adopted to cut power consumption, it is important to suppress reflection (ringing) of an output signal at the output pad. In order to suppress ringing of an output signal, the slew rate of the output waveform must be lowered, but lowering of the slew rate is an obstacle to high-speed output.

On the other hand, it is required of this kind of buffer circuit that the slew rate be changeable in accordance with the specification and so on of the semiconductor integrated circuit. When adjusting the slew rate in this way, there is a problem that reflection (ringing) of output signal increases accordingly. Under the above circumstances, it is important for a buffer circuit that the slew rate of the output waveform thereof can be adjusted with a high degree of freedom.

DETAILED DESCRIPTION

Figure 1:
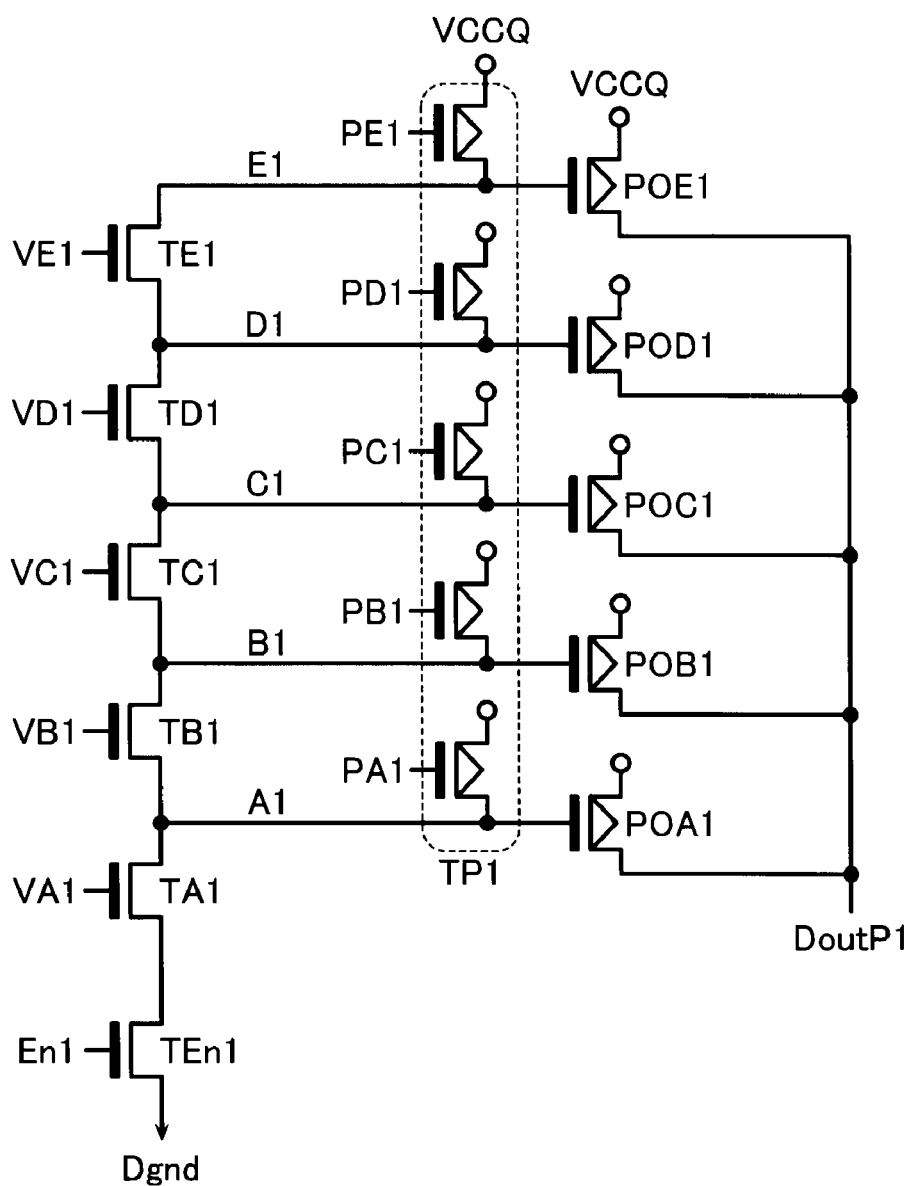
FIG. 1 is an equivalent circuit diagram of a buffer circuit in accordance with a first embodiment of the present invention.

A buffer circuit in accordance with an embodiment comprises a plurality of output transistors connected to form respective current paths in parallel to one another between a first fixed voltage terminal supplying a certain fixed voltage and an output terminal, and a plurality of gate control transistors connected to form respective current paths between a second fixed voltage terminal supplying a certain fixed voltage and a gate of one of the output transistors or between two of gates of the output transistors. The output transistors are configured to turn on to change a voltage of the output terminal. The gate control transistors are configured to apply a gate voltage to the gates of the output transistors to control on/off of the output transistors. A gate of each of the gate control transistors is applied with a certain voltage, such that when a source of each of the gate control transistors changes from a first potential to a second potential, a potential difference between the gate and the source of each of the gate control transistors attains a threshold voltage or greater, whereby each of the gate control transistors is turned on.

Next, embodiments of the present invention are described in detail with reference to the drawings.

First Embodiment

First, a buffer circuit (PMOS output buffer circuit) in accordance with a first embodiment of the present invention is described with reference to FIG. 1.

[Circuit Configuration]

This buffer circuit comprises a plurality (five in FIG. 1) of output transistors POA1, POB1, POC1, POD1, and POE1, a plurality (five in FIG. 1) of pre-charge transistors TP1, a plurality (five in FIG. 1) of gate control transistors TA1, TB1, TC1, TD1, and TE1, and a trigger transistor TEn1. The number five is merely one example, and it goes without saying that the number of output transistors and gate control transistors provided may be other than five.

The output transistors POA1-POE1 are enhancement type PMOS transistors and are connected in parallel between a power supply terminal (first fixed voltage terminal) and an output terminal DoutP1, the power supply terminal supplying a power supply voltage VCCQ which is a fixed voltage. The output transistors POA1-POE1 have their gates connected to nodes A1-E1.

Connected between the nodes A1-E1 and the power supply terminal (VCCQ) are the five pre-charge transistors TP1. The pre-charge transistors TP1 are enhancement type PMOS transistors. The pre-charge transistors TP1 have voltages PA1-PE1 of their gates set to, for example, a ground voltage VSS (0 V), prior to operation of the buffer circuit. This causes the pre-charge transistors TP1 to be set to an on state, whereby nodes A1-E1 are charged to the power supply voltage VCCQ. Subsequent to start of operation of the buffer circuit, the pre-charge transistors TP1 are maintained in an off state.

The gate control transistors TA1-TE1 and the trigger transistor TEn1 are enhancement type NMOS transistors, and are connected in series with each other. The gate control transistor TA1 is connected between node A1 and the drain of the trigger transistor TEn1. The trigger transistor TEn1 has its source connected to a ground terminal Dgnd (second fixed voltage terminal). The other gate control transistors TB1-TE1 are each connected to form a current path between nodes A1-E1 (that is, between two of gates of the output transistors POA1-POE1). Moreover, the gate control transistors TA1-TE1 each have their gates constantly applied with voltages VA1-VE1, so that they are turned on when voltage of their sources falls to a certain voltage. Appropriately setting the value of these voltages VA1-VE1 allows the slew rate of the output signal of the buffer circuit to be adjusted.

Note that the trigger transistor TEn1 has its gate applied with a trigger signal En1 at the start of operation of the buffer circuit, which causes operation of the buffer circuit in FIG. 1 to start. Note also that the voltages VA1-VE1 may all be set to different values of voltage, but, to simplify description, are described here as all having an identical voltage. In addition, the threshold voltages of the transistors TA1-TE1 may also all be set to different values, but are here described as all having the same threshold voltage Vth1. Furthermore, the trigger transistor TEn1 may be omitted by assigning its role to the gate control transistor TA1.

[Operation]

Next, operation of the buffer circuit in the first embodiment is described with reference to a waveform chart of FIG. 2. First, the voltages PA1-PE1 of the gates of the pre-charge transistors TP1 are raised from the ground voltage VSS to the power supply voltage VCCQ. This causes the pre-charge transistors TP1 to switch to an off state (OFF), whereby pre-charge is completed. At this time, nodes A1-E1 are charged to the power supply voltage VCCQ. Thereby, the buffer circuit in FIG. 1 is able to start operation.

Subsequently, the voltage En1 of the gate of the trigger transistor TEn1 rises from the ground voltage VSS to the power supply voltage VCCQ, whereby the trigger transistor TEn1 switches to an on state (ON). When the voltage of the source of the gate control transistor TA1 becomes smaller than (VA1-Vth1), the gate control transistor TA1 is turned on, whereby the potential of node A1 starts to fall towards the ground voltage VSS.

When the voltage of node A1 becomes smaller than (VB1-Vth1), the gate control transistor TB1 is turned on and the potential of node B1 starts to fall towards the ground voltage VSS. Subsequently, by a similar principle, the transistors TC1-TE1 are turned on sequentially, whereby the voltages of nodes C1-E1 start to fall to the ground voltage VSS in a phased manner. This manner of change in the voltages of nodes A1-E1 results in, first, only the output transistor POA1 being turned on, then, the output transistors POB1-POE1 being sequentially turned on, and finally, all the output transistors POA1-POE1 being turned on. This causes the voltage of the output terminal DoutP1 to rise to the voltage VCCQ. The shorter becomes the interval in time for the output transistors POA1-POE1 to be turned on, the larger becomes the gradient (the gradient becomes steeper, and the slew rate becomes greater) of the voltage change curve of this output terminal DoutP1. The slew rate can be adjusted by adjusting the size of the voltages VA1-VE1. Moreover, since the output transistors POA1-POE1 in this buffer circuit are driven in a staggered manner, effects of ringing of output signal are small, even if the slew rate is adjusted by a method such as that described above.

In addition, adjustment of slew rate can also be performed by giving a different size to the output transistors POA1-POE1 in the manufacturing stage.

Modified Example 1 of First Embodiment

Next, a buffer circuit (PMOS output buffer circuit) in accordance with a modified example 1 of the first embodiment of the present invention is described with reference to FIG. 3. Note that in FIG. 3, configurative elements identical to those of FIG. 1 are assigned with symbols identical to those of FIG. 1, and detailed descriptions thereof are omitted.

This modified example 1 differs from the first embodiment in having the voltages VA1-VE1 of the gates of the gate control transistors TA1-TE1 controlled by a constant current circuit CC supplying a constant current Idn1. This configuration allows the voltages of nodes A1-E1 to be lowered having a gradient controlled by this constant current Idn1, and allows the gradient of current (di/dt) flowing in nodes A1-E1 to be suppressed to an appropriate value.

Modified Example 2 of First Embodiment

Figure 4:
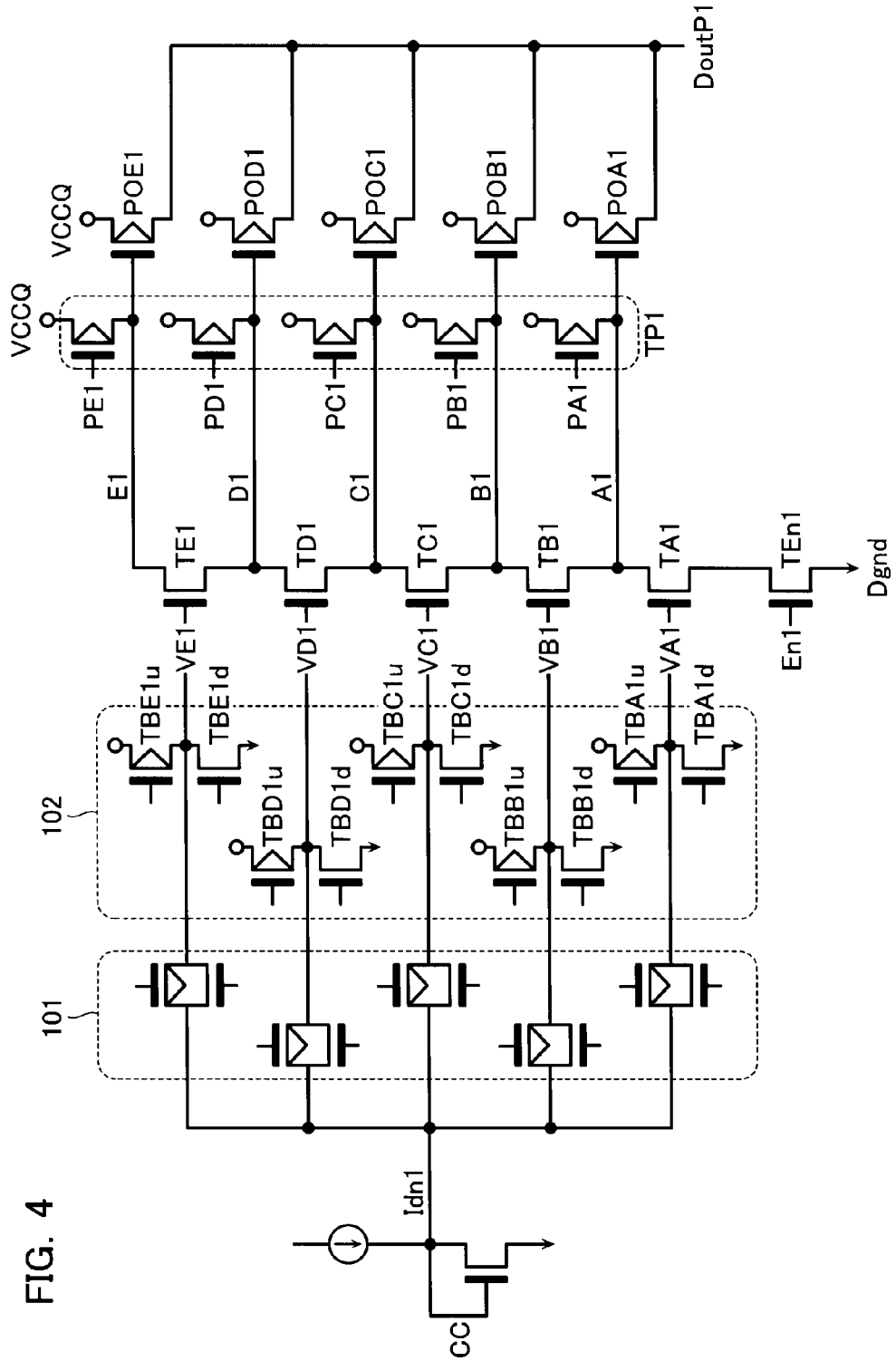
FIG. 4 is an equivalent circuit diagram of a buffer circuit in accordance with a modified example 2 of the first embodiment of the present invention.

Next, a buffer circuit (PMOS output buffer circuit) in accordance with a modified example 2 of the first embodiment of the present invention is described with reference to FIG. 4. Note that in FIG. 4, configurative elements identical to those of FIG. 1 are assigned with symbols identical to those of FIG. 1, and detailed descriptions thereof are omitted.

This modified example 2 differs from the first embodiment in comprising transfer gates 101 and switching circuits 102 between the constant current circuit CC and the gates of the gate control transistors TA1-TE1. The transfer gates 101 are circuits for switching whether or not to supply the current from the constant current circuit CC to the gates of the gate control transistors TA1-TE1. Moreover, the switching circuits 102 include PMOS transistors TBA1$u$-TBE1$u$ connected between the power supply terminal (power supply voltage VCC2) and the gates of the gate control transistors TA1-TE1, and NMOS transistors TBA1$d$-TBE1$d$ connected between the gates of the gate control transistors TA1-TE1 and the ground terminal. On/off control of these transfer gates 101 and switching circuits 102 allows the gates of the gate control transistors TA1-TE1 to selectively have any of a state of being supplied with the current Idn1, a state of being supplied with the power supply voltage VCC2, and a state of being supplied with the ground voltage VSS. This allows the slew rate of the output signal of the buffer circuit to be changed more flexibly.

Second Embodiment

Next, a buffer circuit (NMOS output buffer circuit) in accordance with a second embodiment of the present invention is described with reference to FIG. 5. Note that in FIG. 5, configurative elements identical to those of FIG. 1 are assigned with symbols identical to those of FIG. 1, and detailed descriptions thereof are omitted.

This second embodiment has all the PMOS transistors of the first embodiment substituted by NMOS transistors, and all the NMOS transistors of the first embodiment substituted by PMOS transistors.

That is, this buffer circuit comprises a plurality (five in FIG. 5) of output transistors NOA2, NOB2, NOC2, NOD2, and NOE2, a plurality (five in FIG. 5) of pre-charge transistors TN1, a plurality (five in FIG. 5) of gate control transistors TA2, TB2, TC2, TD2, and TE2, and a trigger transistor TEn2.

The five output transistors NOA2-NOE2 are enhancement type NMOS transistors and are connected in parallel between the ground terminal (ground voltage VSS) and an output terminal DoutN2. The output transistors NOA2-NOE2 have their gates connected to nodes A2-E2.

Connected between the nodes A2-E2 and the ground terminal are the respective pre-charge transistors TN1. The pre-charge transistors TN1 are enhancement type NMOS transistors. The pre-charge transistors TN1 have voltages NA2-NE2 of their gates set to, for example, the power supply voltage VCC2, prior to operation of the NMOS output buffer circuit shown in FIG. 5. This causes the pre-charge transistors TN1 to be set to an on state, whereby nodes A2-E2 are discharged to the ground voltage VSS. Subsequent to start of operation of the NMOS output buffer circuit, the pre-charge transistors TN1 are all maintained in an off state.

The gate control transistors TA2-TE2 and the trigger transistor TEn2 are enhancement type PMOS transistors, and are connected in series with each other. The gate control transistor TA2 is connected between node A2 and the drain of the trigger transistor TEn2. The trigger transistor TEn2 has its source connected to a power supply terminal Dvcc2. The other gate control transistors TB2-TE2 are each connected to form a current path between two of nodes A2-E2 (between nodes A2 and B2, between nodes B2 and C2, between nodes C2 and D2, and between nodes D2 and E2). Moreover, the gate control transistors TA2-TE2 each have their gates constantly applied with voltages VA2-VE2, so that they are turned on when voltage of their sources rises to a certain voltage. Appropriately setting the value of these voltages VA2-VE2 allows the slew rate of the output signal from the output terminal DoutN2 of the buffer circuit to be adjusted. Note that the trigger transistor TEn2 has its gate applied with a trigger signal En2 at the start of operation of the buffer circuit. Moreover, the trigger transistor TEn2 may be omitted by assigning its role to the gate control transistor TA2.

[Operation]

Figure 6:
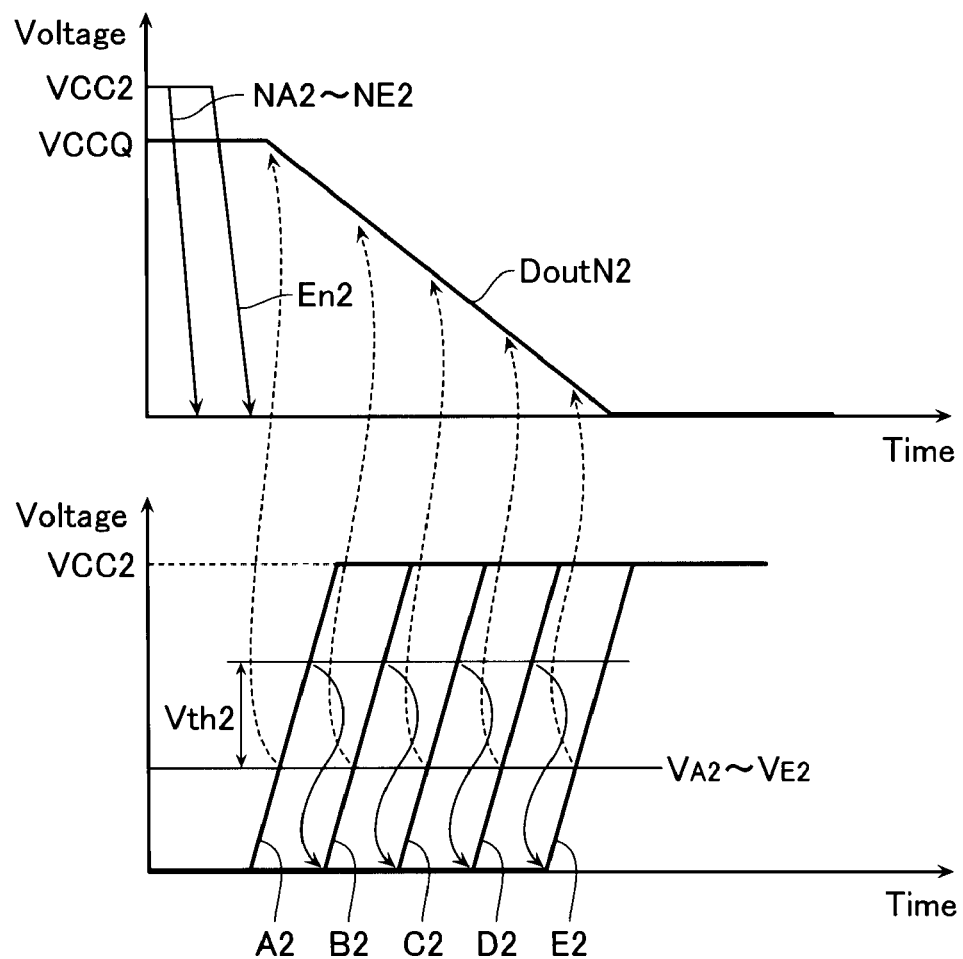
FIG. 6 is a waveform chart showing operation of the buffer circuit in accordance with the second embodiment of the present invention.

Next, operation of the buffer circuit in the second embodiment is described with reference to a waveform chart of FIG. 6. Here, description proceeds on the assumption that the threshold voltages of the gate control transistors TA2-TE2 are all Vth2, and, moreover, that the voltages VA2-VE2 are all of equal value.

First, the voltages NA2-NE2 of the gates of the pre-charge transistors TN1 are lowered from the power supply voltage VCC2 to the ground voltage VSS. This causes the pre-charge transistors TN1 to switch to an off state (OFF), whereby pre-charge is completed. Thereby, the buffer circuit in FIG. 5 is able to start operation. At this time, nodes A2-E2 have the ground voltage VSS.

Subsequently, the voltage level of signal En2 of the gate of the trigger transistor TEn2 falls from the power supply voltage VCC2 to the ground voltage VSS, whereby the trigger transistor TEn2 switches to an on state (ON). As a result, when the voltage of the source of the gate control transistor TA2 becomes larger than (VA2+Vth2), the gate control transistor TA2 is turned on, whereby the potential of node A2 starts to rise towards the power supply voltage VCC2.

When the voltage of node A2 becomes larger than (VB2+Vth2), the gate control transistor TB2 is turned on and the potential of node B2 starts to rise towards the power supply voltage VCC2. Subsequently, by a similar principle, the transistors TC2-TE2 are turned on sequentially, whereby the voltages of nodes C2-E2 start to rise to the power supply voltage VCC2 in a phased manner. This manner of change in the voltages of nodes A2-E2 results in, first, only the output transistor NOA2 being turned on, then, the output transistors NOB2-NOE2 being sequentially turned on, and finally, all the output transistors NOA2-NOE2 being turned on. This causes the voltage of the output terminal DoutN2 to fall from the voltage VCCQ to the ground voltage VSS. The shorter becomes the interval in time for the output transistors NOA2-NOE2 to be turned on, the larger becomes the gradient (the gradient becomes steeper, and the slew rate becomes greater) of the voltage change curve of this output terminal DoutN2. The slew rate can be adjusted by individually adjusting the size of the voltages VA2-VE2. Moreover, since the output transistors NOA2-NOE2 in this buffer circuit are driven in a staggered manner, effects of ringing of output signal are small, even if the slew rate is adjusted by a method such as that described above. In addition, adjustment of slew rate can also be performed by giving a different size to the output transistors NOA2-NOE2 in the manufacturing stage.

Modified Example 1 of Second Embodiment

Figure 7:
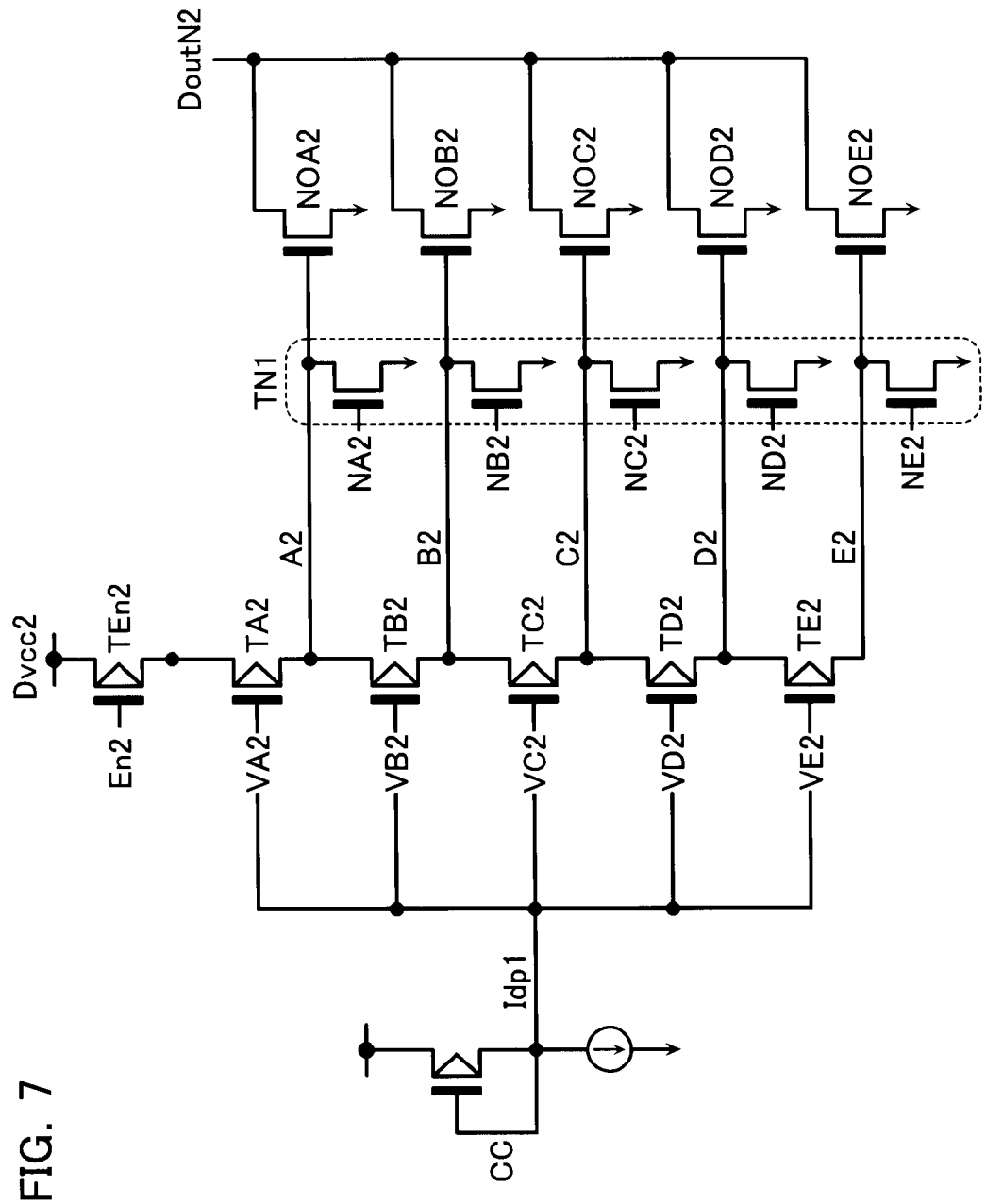
FIG. 7 is an equivalent circuit diagram of a buffer circuit in accordance with a modified example 1 of the second embodiment of the present invention.

Next, a buffer circuit in accordance with a modified example 1 of the second embodiment of the present invention is described with reference to FIG. 7. Note that in FIG. 7, configurative elements identical to those of FIG. 5 are assigned with symbols identical to those of FIG. 5, and detailed descriptions thereof are omitted.

This modified example 1 differs from the second embodiment in having the voltages VA2-VE2 of the gates of the gate control transistors TA2-TE2 controlled by the constant current circuit CC, similarly to the modified example 1 of the first embodiment.

Modified Example 2 of Second Embodiment

Figure 8:
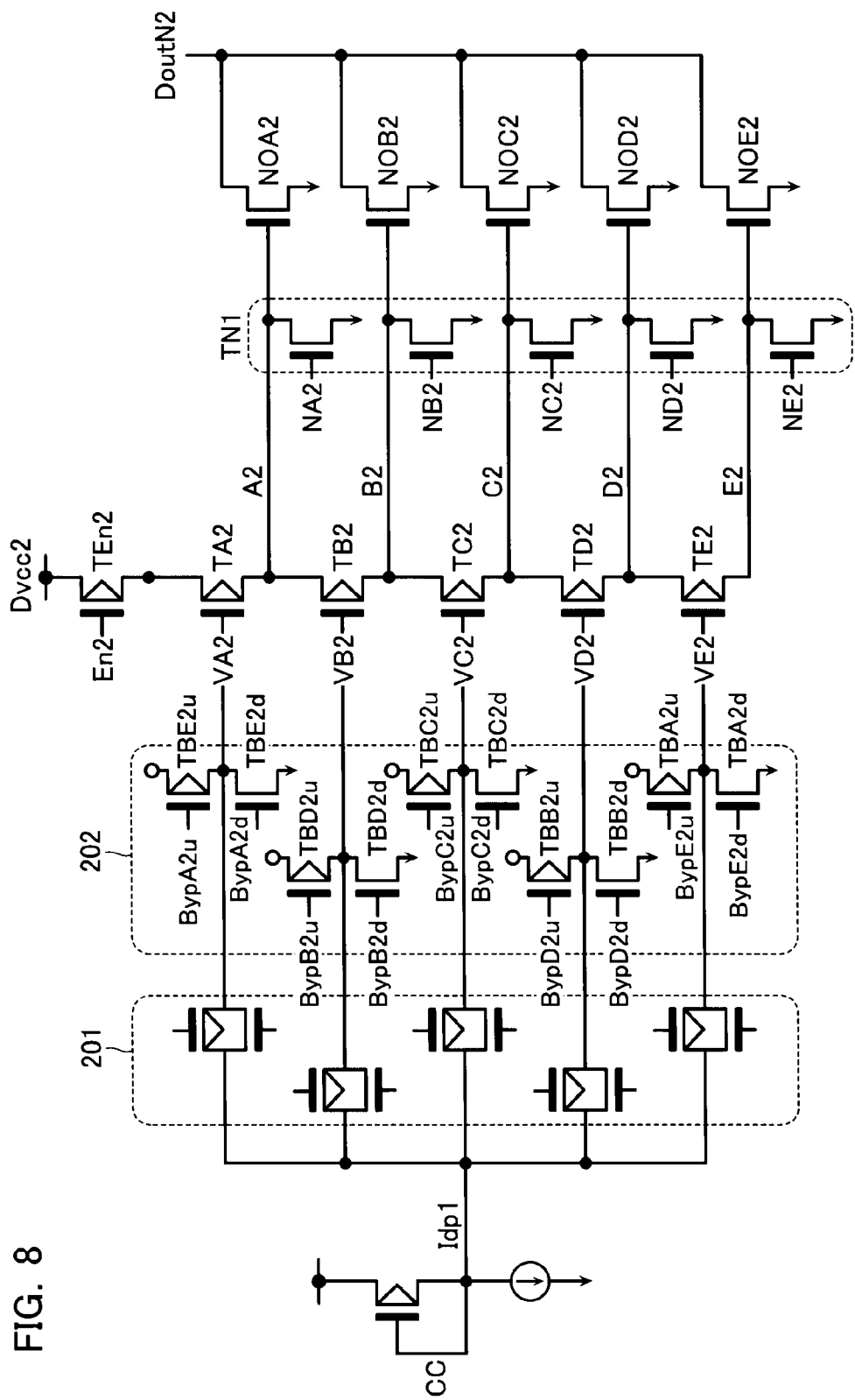
FIG. 8 is an equivalent circuit diagram of a buffer circuit in accordance with a modified example 2 of the second embodiment of the present invention.

Next, a buffer circuit in accordance with a modified example 2 of the second embodiment of the present invention is described with reference to FIG. 8. Note that in FIG. 8, configurative elements identical to those of FIG. 5 are assigned with symbols identical to those of FIG. 5, and detailed descriptions thereof are omitted.

This modified example 2 differs from the second embodiment in comprising transfer gates 201 and switching circuits 202 between the constant current circuit CC and the gate control transistors TA2-TE2, similarly to the modified example 2 of the first embodiment.

Third Embodiment

Next, a buffer circuit in accordance with a third embodiment of the present invention is described with reference to FIG. 9. Note that configurative elements identical to those of FIGS. 1-8 are assigned with identical symbols, and detailed descriptions thereof are omitted.

Figure 5:
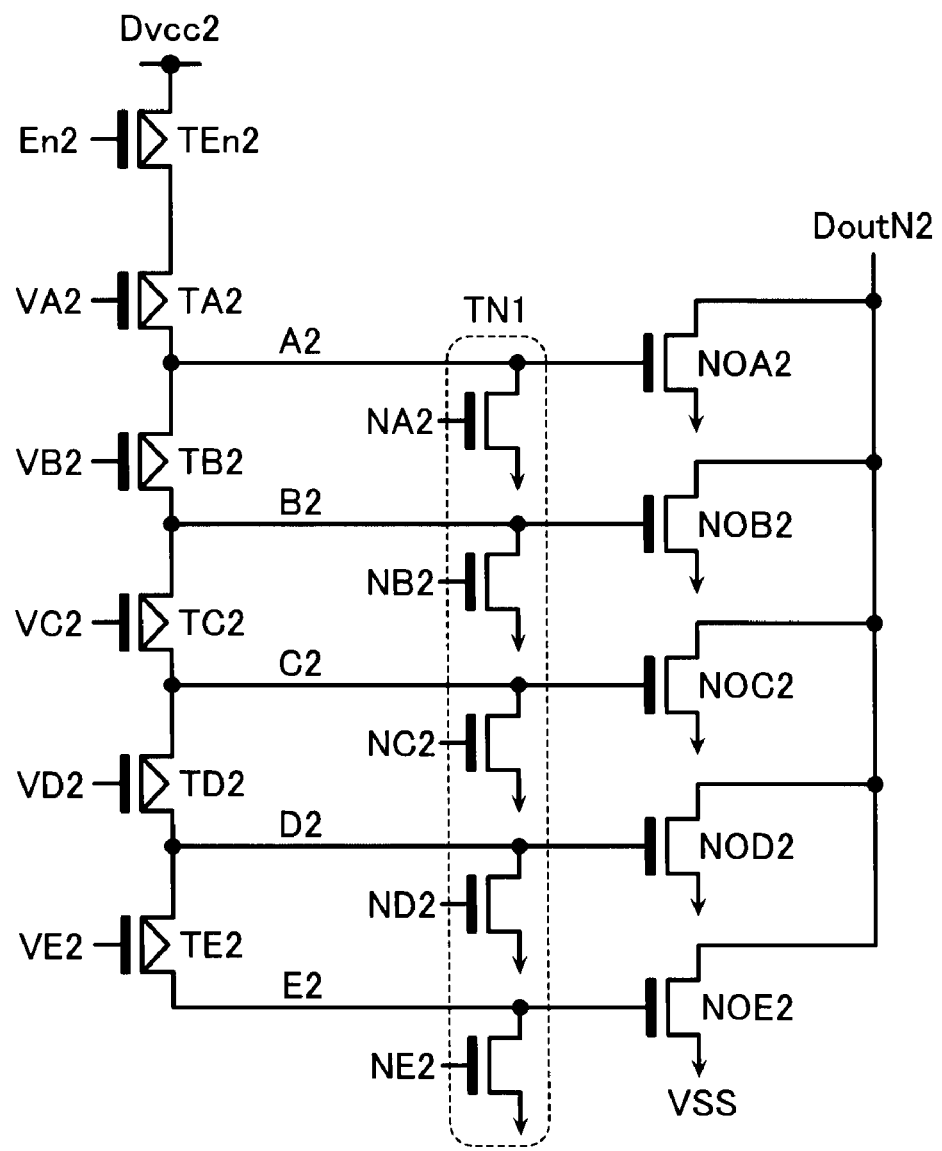
FIG. 5 is an equivalent circuit diagram of a buffer circuit in accordance with a second embodiment of the present invention.
Figure 9:
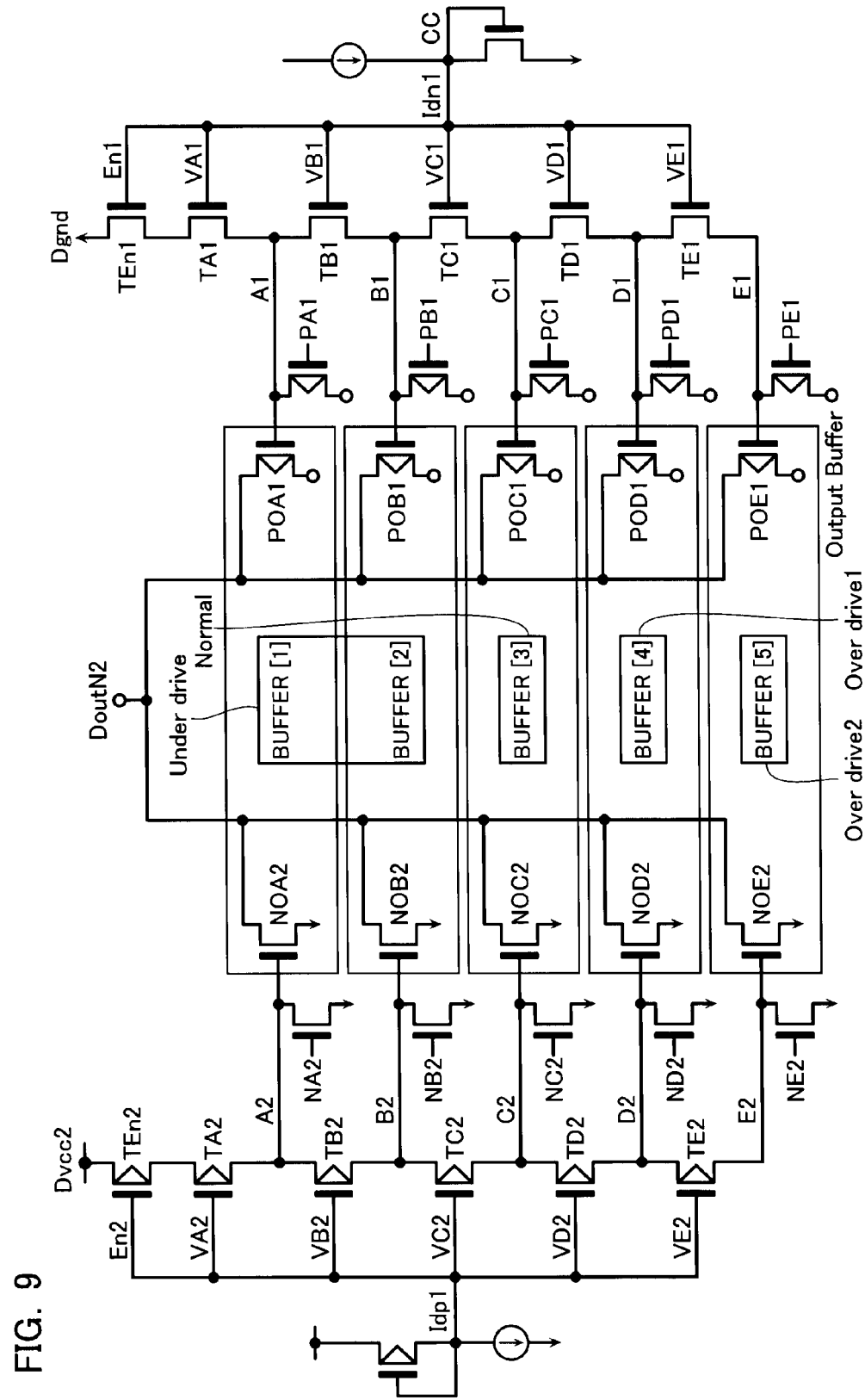
FIG. 9 is an equivalent circuit diagram of a buffer circuit in accordance with a third embodiment of the present invention.

As shown in FIG. 9, this third embodiment is configured as a CMOS output buffer circuit combining the PMOS output buffer circuit of the first embodiment (FIG. 1) and the NMOS output buffer circuit of the second embodiment (FIG. 5). The transistors POA1 and NOA2 configure a first stage buffer circuit BUFFER [1]. Similarly, the transistors POB1 and NOB2 configure a second stage buffer circuit BUFFER [2], the transistors POC1 and NOC2 configure a third stage buffer circuit BUFFER [3], the transistors POD1 and NOD2 configure a fourth stage buffer circuit BUFFER [4], and the transistors POE1 and NOE2 configure a fifth stage buffer circuit BUFFER [5]. In accordance with design requirements and the like, these multiple stages of buffer circuits BUFFER [1]-[5] can be switched, for example, between a low drive state (Under Drive) in which only buffer circuits BUFFER [1] and [2] are driven, a normal drive state (Normal) in which buffer circuits BUFFER [1]-[3] are driven, a first high drive state (Over Drive 1) in which buffer circuits BUFFER [1]-[4] are driven, and a second high drive state (Over Drive 2) in which all buffer circuits BUFFER [1]-[5] are driven.

Figure 10:
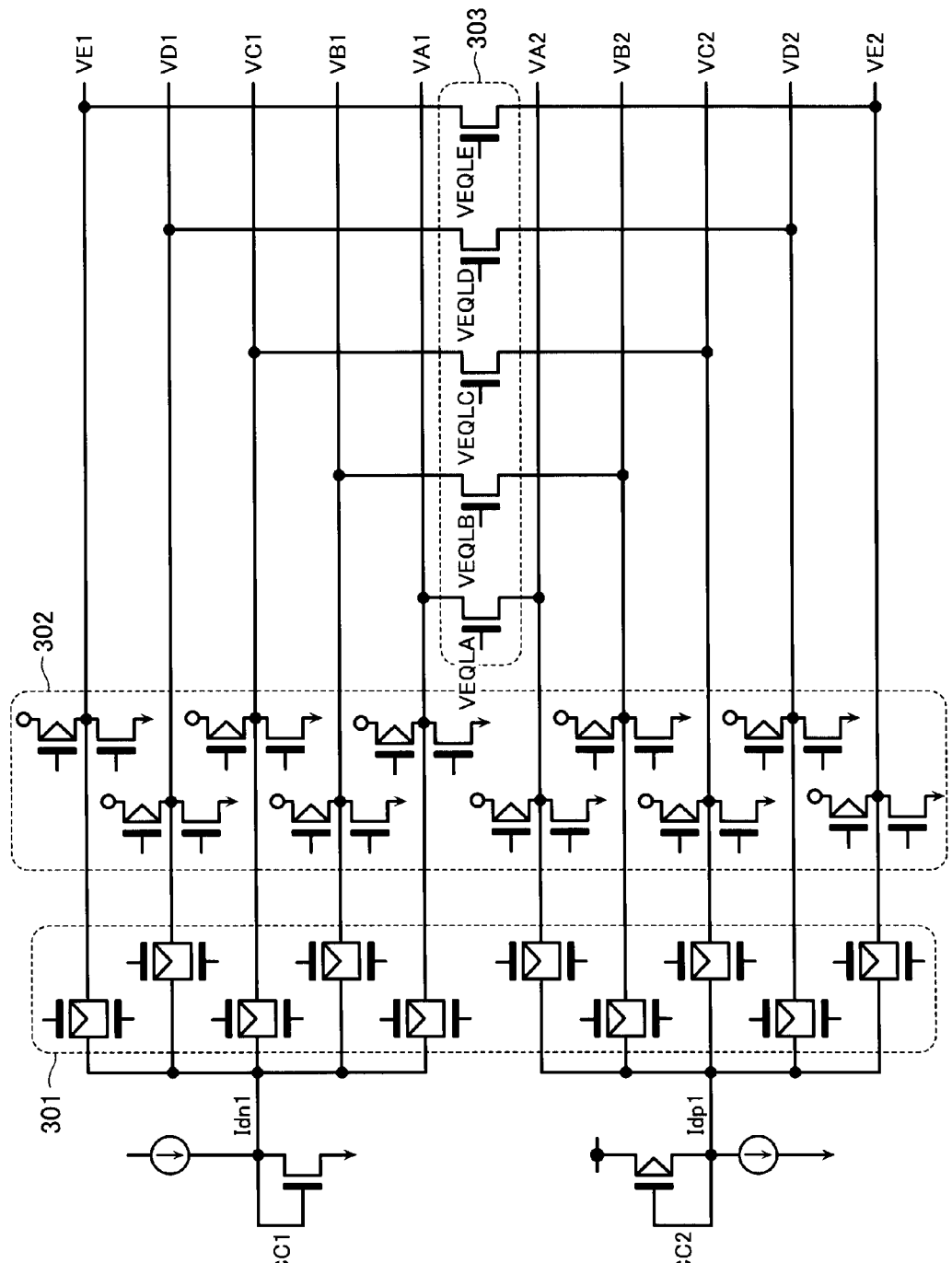
FIG. 10 is an equivalent circuit diagram of a circuit for supplying a voltage to gates of gate control transistors TA1-TE1 and TA2-TE2 in the buffer circuit shown in FIG. 9.

FIG. 10 is an equivalent circuit diagram of a circuit for supplying a voltage to gates of the gate control transistors TA1-TE1 and TA2-TE2 in the buffer circuit shown in FIG. 9. Disposed between constant current circuits CC1 and CC2 and gates of the gate control transistors TA1-TE1 and TA2-TE2 are transfer gates 301 and switching circuits 302. The transfer gates 301 and switching circuits 302 have an identical configuration to the transfer gates 101 and switching circuits 102 of the first embodiment, and detailed descriptions thereof are thus omitted.

In addition, equalize transistors 303 form current paths between, respectively, the gate of the transistor TA1 and the gate of the transistor TA2, the gate of the transistor TB1 and the gate of the transistor TB2, the gate of the transistor TC1 and the gate of the transistor TC2, the gate of the transistor TD1 and the gate of the transistor TD2, and the gate of the transistor TE1 and the gate of the transistor TE2. These equalize transistors 303 are turned on by gate signals VEQLA-VEQLE rising to, for example, the power supply voltage VCC2 prior to the operation of the buffer circuit, and function to bring the potential of the gates of the transistors TA1-TE1 and the potential of the transistors TA2-TE2 close to each other. This enables the charging operation of the constant current circuits CC1 and CC2 to be assisted.

In this buffer circuit of FIG. 9, when, for example, operation of the fifth stage buffer circuit BUFFER [5] is stopped, the switching circuit 302 is used to charge/discharge the voltage VE2 to the power supply voltage VCC2 and the voltage VE1 to the ground voltage VSS. Subsequently, when the buffer circuit BUFFER [5] is switched to operation state, the voltages VE1 and VE2 are charged to a voltage midway between the power supply voltage VCC2 and VSS. At that time, if only the constant current circuits CC1 and CC2 are relied upon, the charging/discharging of the voltages VE1 and VE2 takes a long time. Accordingly, in the present embodiment, these equalize transistors 303 are turned on to bring the potential of the two gates close to each other. This allows the voltage VE1 and VE2 (same as VA1 and VA2, VB1 and VB2, VC1 and VC2, and VD1 and VD2) to reach certain voltage more speedily than when charge/discharge starts from the power supply voltage VCC2 and the ground voltage VSS.

Fourth Embodiment

Next, a buffer circuit in accordance with a fourth embodiment of the present invention is described with reference to FIG. 11. Note that in FIG. 11, configurative elements identical to those of FIG. 1 are assigned with symbols identical to those of FIG. 1, and detailed descriptions thereof are omitted.

This fourth embodiment differs from the first embodiment in comprising a discharge auxiliary circuit 401 in addition to the configurations of the first embodiment (FIG. 1). This discharge auxiliary circuit 401 functions to start a discharge operation of nodes A1-E1 when the voltage of those nodes A1-E1 has fallen to a certain voltage, thereby assisting in discharging the voltage of nodes A1-E1 to the ground voltage VSS. This discharge auxiliary circuit 401 includes inverters IA1-IE1 each having its input terminal connected to a respective one of nodes A1-E1. In addition, the discharge auxiliary circuit 401 includes enhancement type NMOS transistors TAa1$u$-TEa1$u$ each having its drain connected to a respective one of nodes A1-E1. The NMOS transistors TAa1$u$-TEa1$u$ have their gates connected to the output terminals of the inverters IA1-IE1. Moreover, connected between sources of the NMOS transistors TAa1$u$-TEa1$u$ and the ground terminal are enhancement type NMOS transistors TAa1$d$-TEa1$d$. The NMOS transistors TAa1$d$-TEa1$d$ have their gates commonly applied with an enable signal Ena1. The enable signal Ena1 rises to "H" at a certain timing subsequent to the buffer circuit in FIG. 11 starting operation, whereby the NMOS transistors TAa1$d$-TEa1$d$ are turned on.

Figure 11:
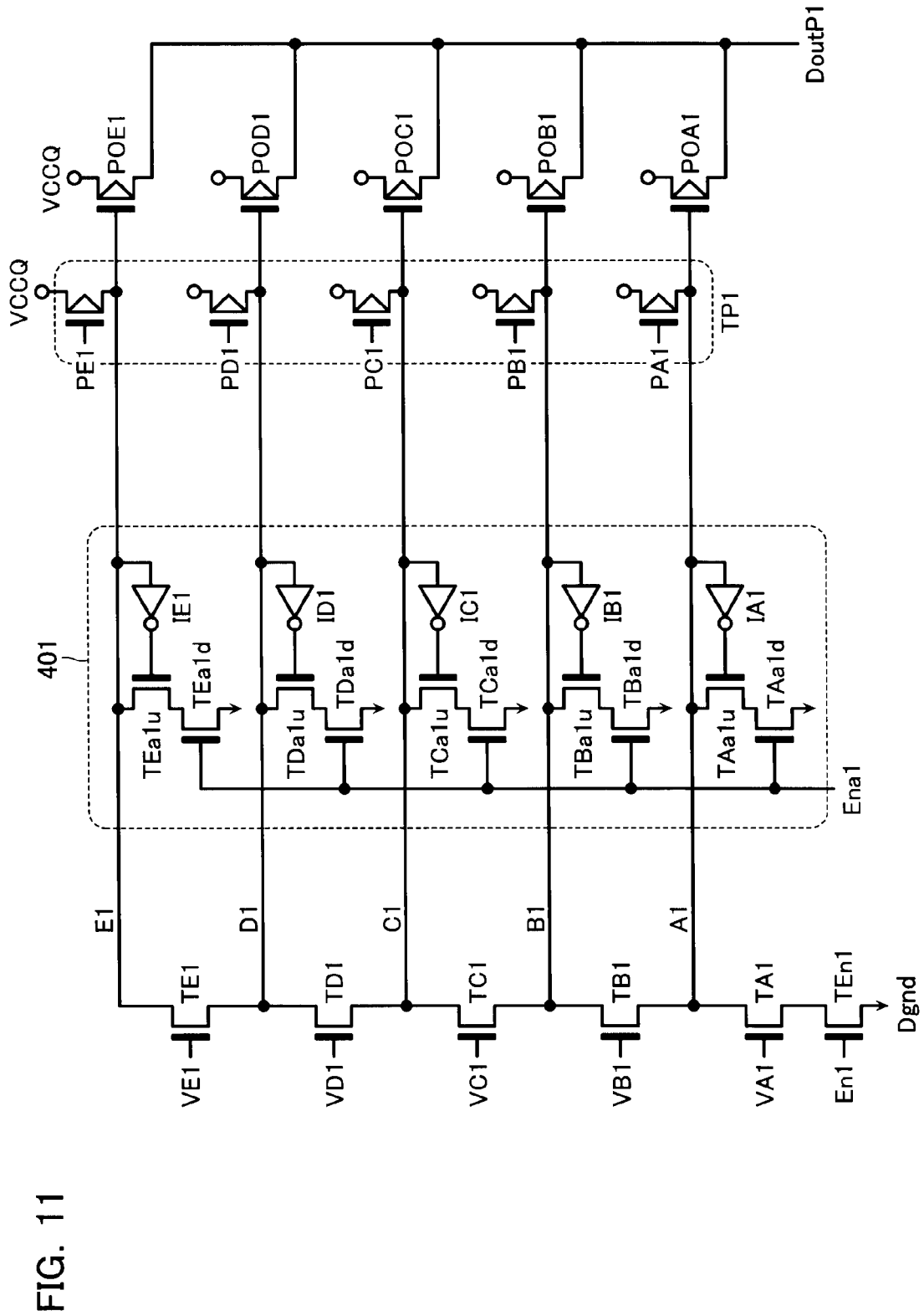
FIG. 11 is an equivalent circuit diagram of a buffer circuit in accordance with a fourth embodiment of the present invention.

Next, operation of this buffer circuit in FIG. 11 is described.

Figure 2:
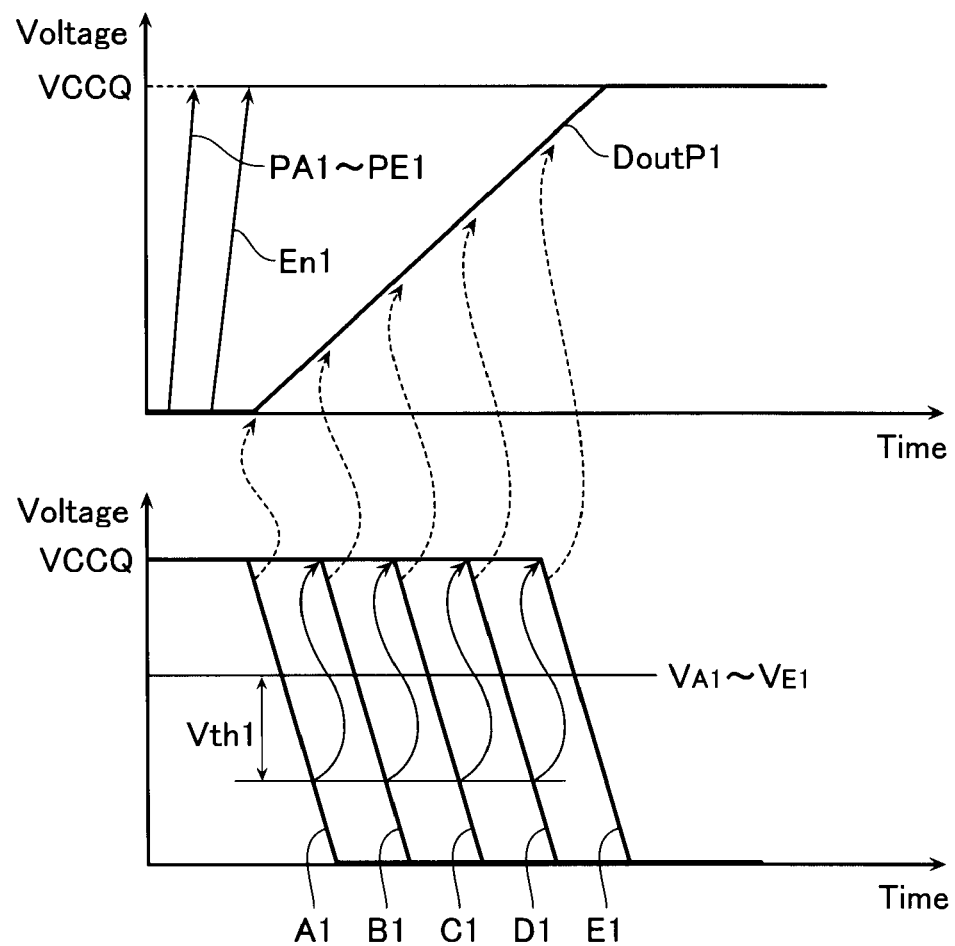
FIG. 2 is a waveform chart showing operation of the buffer circuit in accordance with the first embodiment of the present invention.
Figure 12:
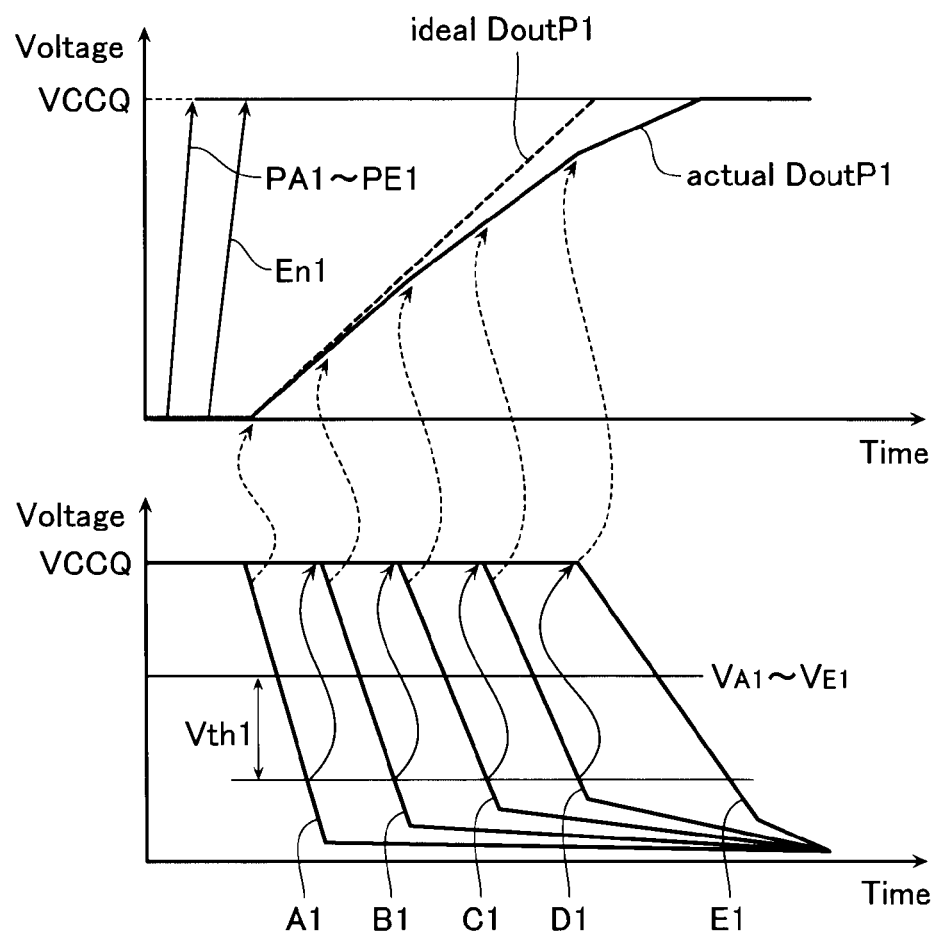
FIG. 12 is a waveform chart showing actual operation of the buffer circuit in accordance with the first embodiment of the present invention.

The buffer circuit of the first embodiment theoretically operates as shown in FIG. 2. However, in practice, discharge of node A1 starts, and subsequently as the number of nodes B1, C1, . . . subject to discharge increases, the gradient of the discharge curve of each of nodes A1-E1 becomes less steep, as shown in FIG. 12. As a result, the gradient of the output signal from the output terminal DoutP1 becomes smaller. This is because the discharge path of each of nodes A1-E1 is the gate control transistors TA1-TE1 and the trigger transistor TEn1 only, these gate control transistors TA1-TE1 and trigger transistor TEn1 being connected in series.

Figure 13:
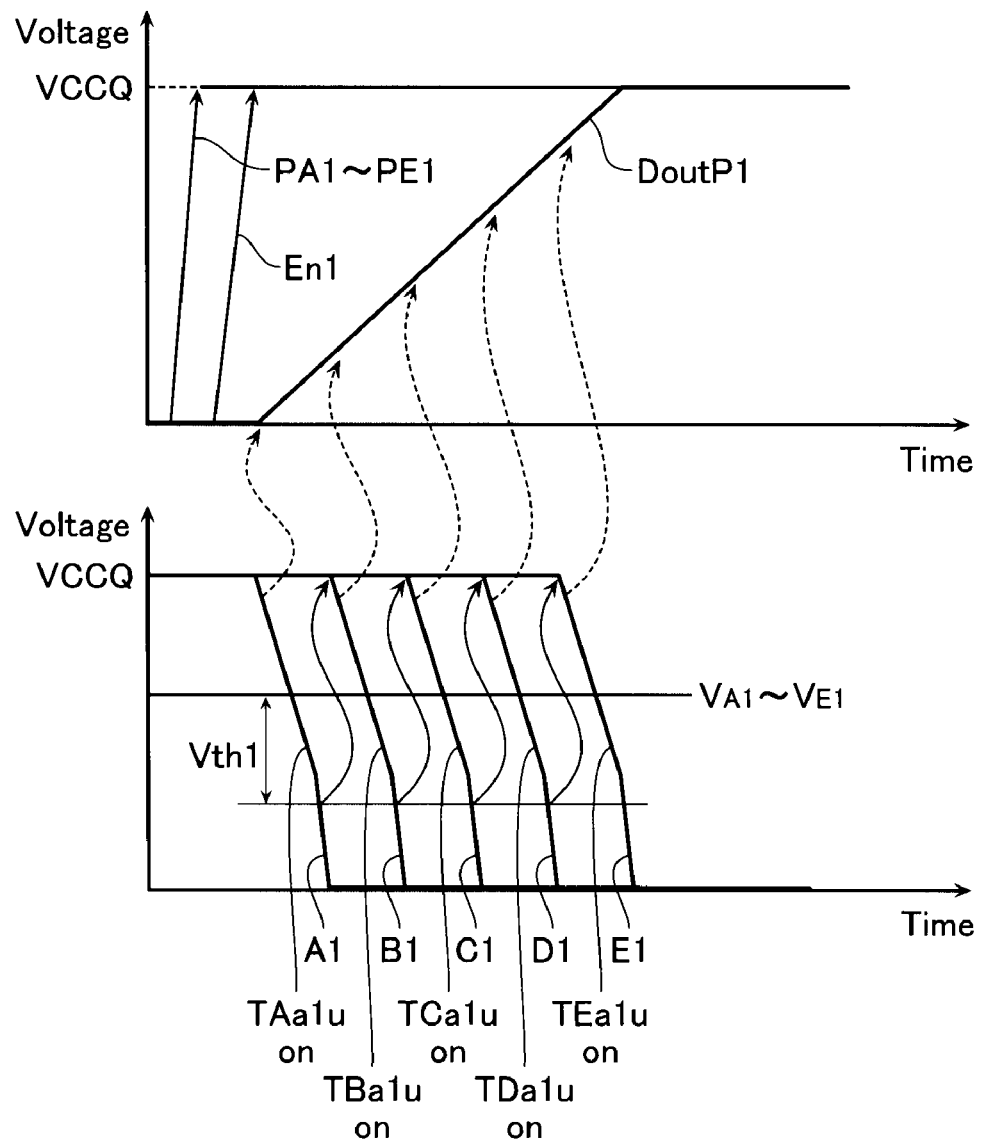
FIG. 13 is a waveform chart showing operation of the buffer circuit in accordance with the fourth embodiment of the present invention.

Regarding this point, the fourth embodiment has a discharge path due to the discharge auxiliary circuit 401 formed additionally in parallel to the above-described discharge path due to the series circuit of the gate control transistors TA1-TE1. Hence, there is not reduction in steepness of the discharge curves of nodes A1-E1, rather the curves are accelerated (refer to FIG. 13). This operation is described in further detail while referring to FIG. 13.

In this buffer circuit of FIG. 11, the potential of nodes A1-E1 falls towards the ground voltage VSS as shown in FIG. 2, and, when the potential of nodes A1-E1 becomes smaller than the threshold voltage of the inverters IA1-IE1, the output signal of the inverters IA1-IE1 switches from "L" to "H". As a result, the NMOS transistors TAa1$u$-TEa1$u$ are sequentially turned on. This causes the charge of nodes A1-E1 to flow via the transistors TAa1$u$-TEa1$u$ and TAa1$d$-TEa1$d$ to the ground terminal, whereby discharge of nodes A1-E1 is accelerated.

Fifth Embodiment

Figure 14:
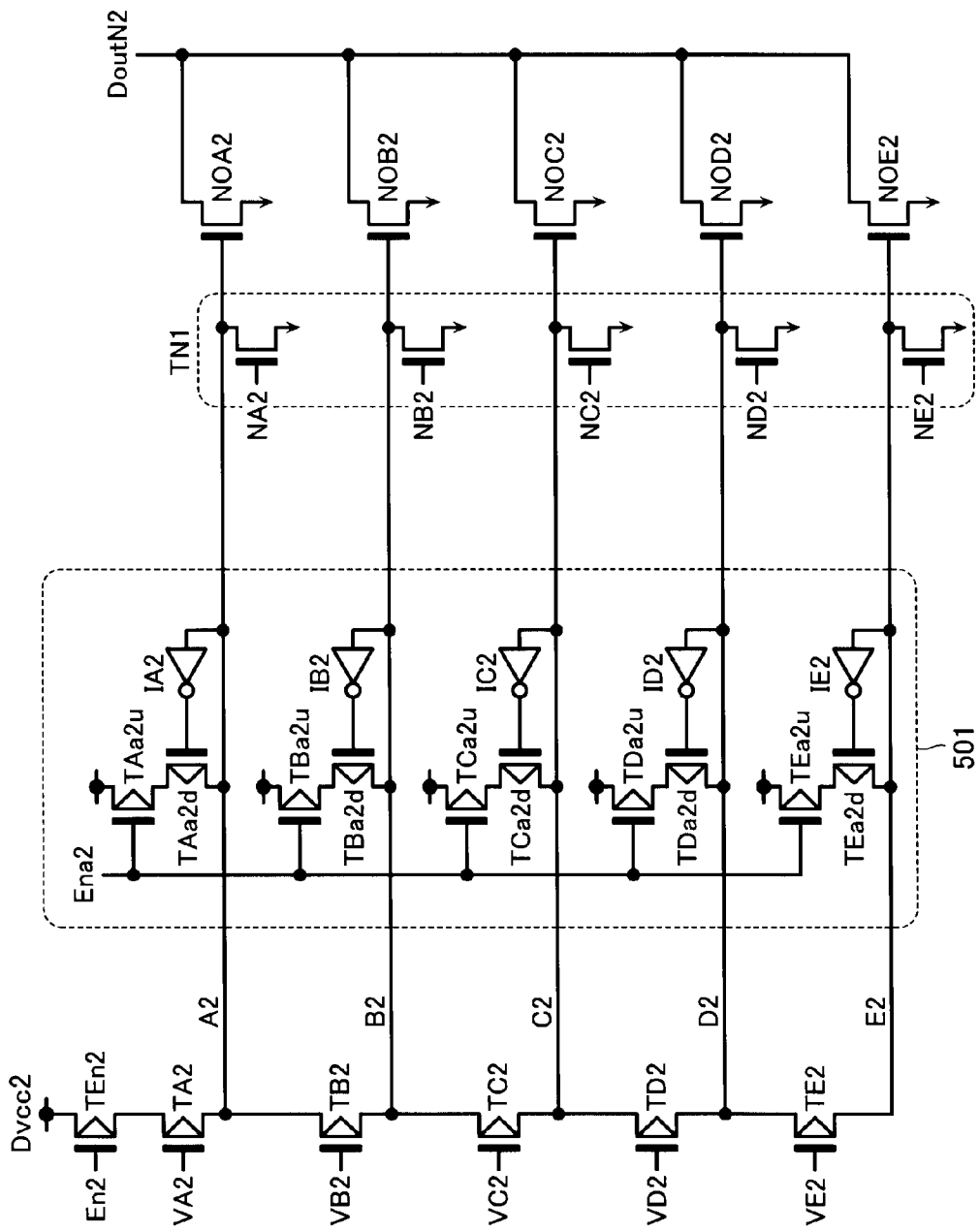
FIG. 14 is an equivalent circuit diagram of a buffer circuit in accordance with a fifth embodiment of the present invention.

Next, a buffer circuit in accordance with a fifth embodiment of the present invention is described with reference to FIG. 14. This fifth embodiment has a charge auxiliary circuit 501 added to the second embodiment (FIG. 5). Note that in FIG. 14, configurative elements identical to those of FIG. 5 are assigned with symbols identical to those of FIG. 5, and detailed descriptions thereof are omitted. This charge auxiliary circuit 501 is configured to start a charge operation of nodes A2-E2 when the voltage of those nodes A2-E2 has risen to a certain voltage.

One example of this charge auxiliary circuit 501 comprises inverters IA2-IE2, enhancement type PMOS transistors TAa2$d$-TEa2$d$, and enhancement type PMOS transistors TAa2$u$-TEa2$u$. The inverters IA2-IE2 have their input terminals connected to respective nodes A2-E2. In addition, the PMOS transistors TAa2$d$-TEa2$d$ have their drains connected to respective nodes A2-E2, and, further, have their sources connected to drains of the PMOS transistors TAa2$u$-TEa2$u$. The PMOS transistors TAa2$u$-TEa2$u$ have their sources connected to the power supply terminal. The PMOS transistors TAa2$u$-TEa2$u$ have their gates commonly applied with an enable signal Ena2. The enable signal Ena2 falls to "L" at a certain timing subsequent to the NMOS output buffer circuit in FIG. 14 starting operation, whereby the PMOS transistors TAa2$u$-TEa2$u$ are turned on.

The fifth embodiment has a charge path due to the charge auxiliary circuit 501 formed additionally in parallel to a charge path due to a series circuit of the gate control transistors TA2-TE2. Hence, there is not reduction in steepness of the charge curves of nodes A2-E2, rather the curves are accelerated. Although there are some differences in operation between charging and discharging, details of operation are substantially similar to those for operation of the discharge auxiliary circuit 401, and a description of operation is thus omitted.

Sixth Embodiment

Figure 15:
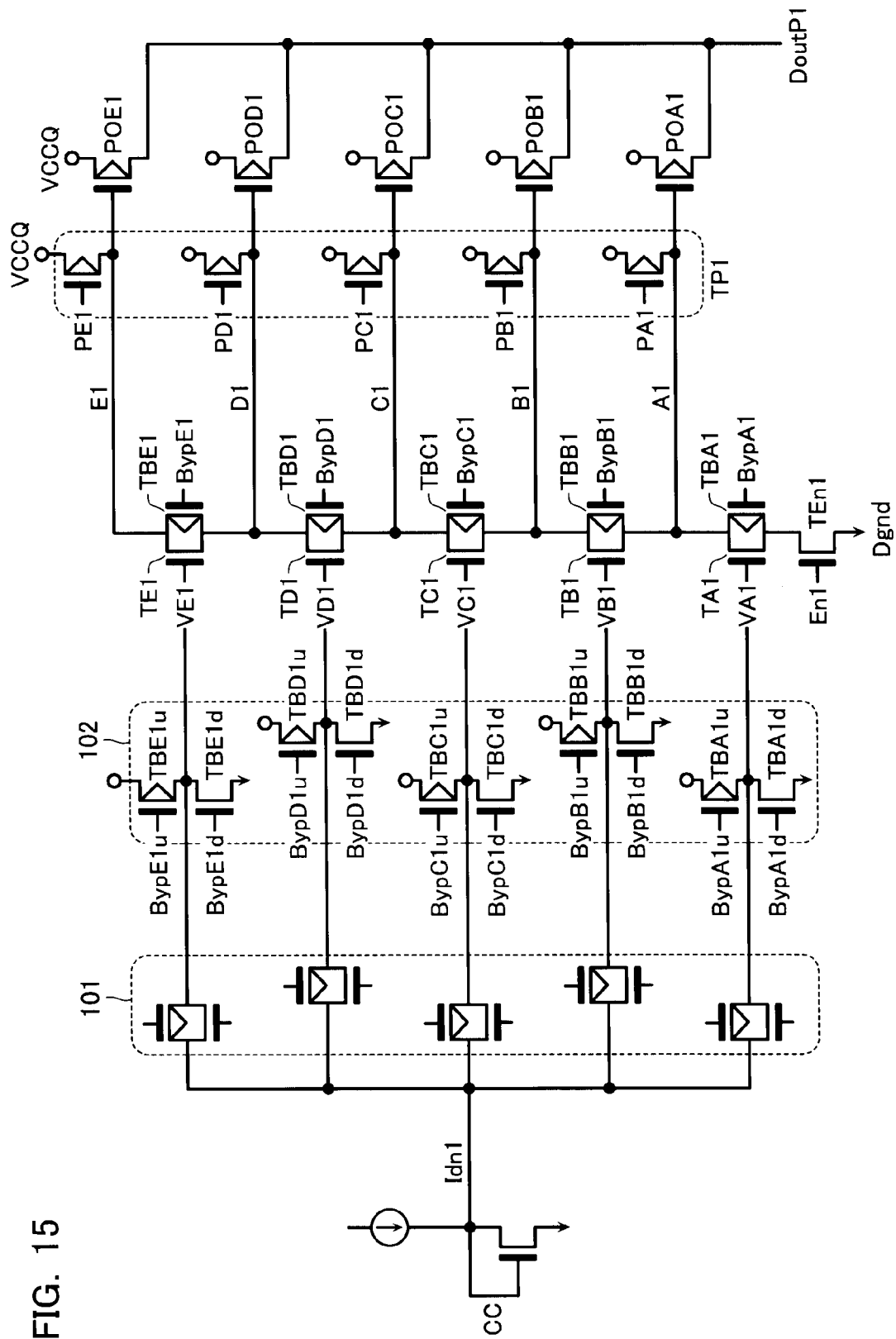
FIG. 15 is an equivalent circuit diagram of a buffer circuit in accordance with a sixth embodiment of the present invention.

Next, a buffer circuit in accordance with a sixth embodiment of the present invention is described with reference to FIG. 15. This embodiment is the modified example 1 of the first embodiment with a further modification added. Note that in FIG. 15, configurative elements identical to those of FIG. 4 are assigned with symbols identical to those of FIG. 4, and detailed descriptions thereof are omitted.

This sixth embodiment differs from the modified example 1 of the first embodiment in having PMOS transistors TBA1-TBE1 (bypass transistors) connected in parallel to the gate control transistors TA1-TE1.

In the modified example 1 of the first embodiment, when the activation time of some of the five output transistors POA1-POE1 be particularly speeded up, the PMOS transistors TBA1$u$-TBE1$u$ in the corresponding switching circuit 102 need only be turned on whereby the transistors TA1-TE1 are quickly turned on. In this sixth embodiment, in addition to the above, at least one of the PMOS transistors TBA1-TBE1 is set to an on state by having its voltage BypA1-BypE1 set to "L", thereby enabling further speeding up of time for nodes A1-E1 to be turned on, and, as a result, enabling speeding up of timing for the output transistors POA1-POE1 to be turned on. As an example, when the output transistors POA1-POE1 be set to an on state substantially simultaneously, it is required only to set all of voltages BypA1$u$-BypE1$u$ and voltages BypA1-BypE1 to "L". As a result, the transistors TA1-TE1 and TBA1-TBE1 are all held in an on state, and, subsequent to turning on of the trigger transistor TEn1, the five output transistors can be switched to an on state substantially simultaneously.

Moreover, as another example, when only the output transistors POC1 and POD1 be set to an on state substantially simultaneously, it is required only to set voltages BypD1 and BypD1$u$ to "L", thereby turning on the transistors TBD1 and TD1. Note that the discharge auxiliary circuit 401 as shown in FIG. 11 may be added in this sixth embodiment.

Seventh Embodiment

Figure 16:
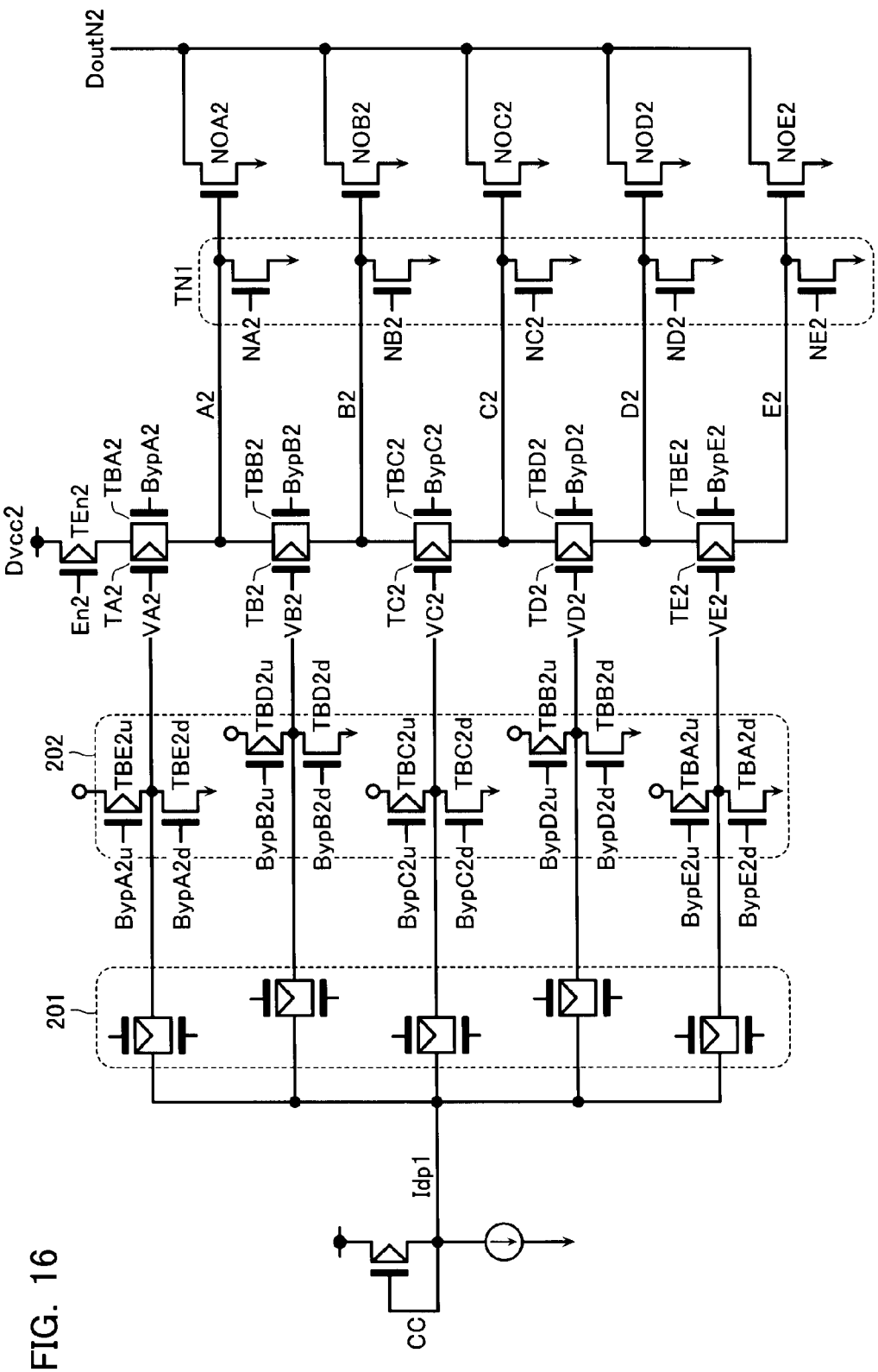
FIG. 16 is an equivalent circuit diagram of a buffer circuit in accordance with a seventh embodiment of the present invention.

Next, a buffer circuit in accordance with a seventh embodiment of the present invention is described with reference to FIG. 16. This embodiment is the modified example 2 of the second embodiment (FIG. 8) with a further modification added. Note that in FIG. 16, configurative elements identical to those of FIG. 8 are assigned with symbols identical to those of FIG. 8, and detailed descriptions thereof are omitted.

This seventh embodiment differs from the modified example 2 of the second embodiment in having NMOS transistors TBA2-TBE2 (bypass transistors) connected in parallel to the gate control transistors TA2-TE2. The function of the NMOS transistors TBA2-TBE2 is similar to that of the PMOS transistors TBA1-TBE1 in the sixth embodiment. This embodiment also displays similar advantages to those of the sixth embodiment due to the PMOS transistors TBA1-TBE1.

Eighth Embodiment

Figure 17:
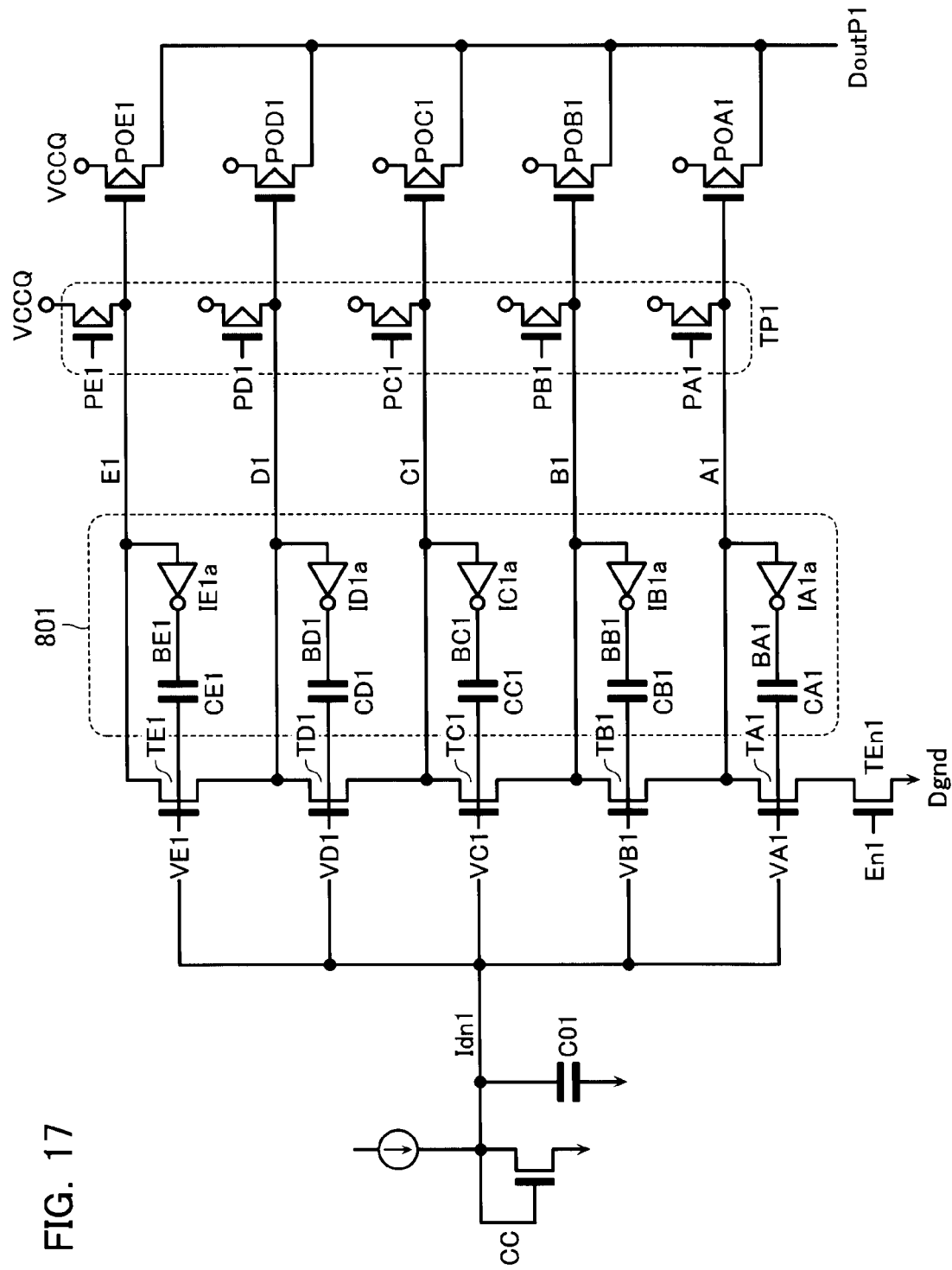
FIG. 17 is an equivalent circuit diagram of a buffer circuit in accordance with an eighth embodiment of the present invention.

Next, a buffer circuit in accordance with an eighth embodiment of the present invention is described with reference to FIG. 17. This eighth embodiment is the modified example 1 of the first embodiment (FIG. 3) with a further modification added. Note that in FIG. 17, configurative elements identical to those of FIG. 3 are assigned with symbols identical to those of FIG. 3, and detailed descriptions thereof are omitted.

Figure 3:
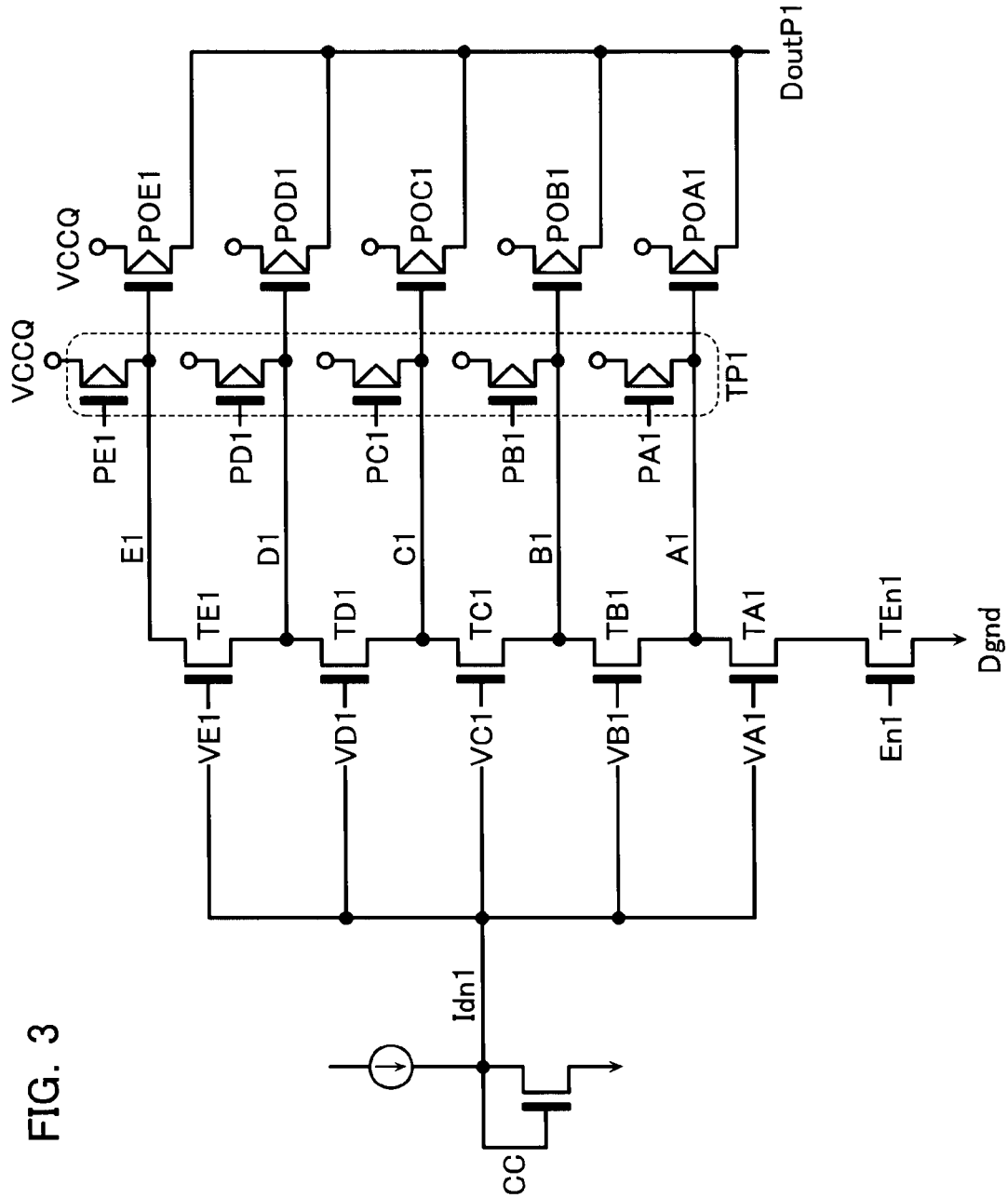
FIG. 3 is an equivalent circuit diagram of a buffer circuit in accordance with a modified example 1 of the first embodiment of the present invention.

This eighth embodiment differs from the first embodiment in having a coupling circuit 801 provided in addition to the configurations of the modified example 1 of the first embodiment (FIG. 3). This coupling circuit 801 functions to suppress a lowering of the current Idn1 caused by coupling due to a sudden drop in voltage of nodes A1-E1.

One example of this coupling circuit 801 comprises inverters IA1a-IE1a and capacitors CA1-CE1. The inverters IA1a-IE1a have their input terminals connected to nodes A1-E1 and their output terminals (nodes BA1-BE1) connected to one ends of the capacitors CA1-CE1. In addition, the capacitors CA1-CE1 have their other ends connected to gates of the gate control transistors TA1-TE1.

Figure 18:
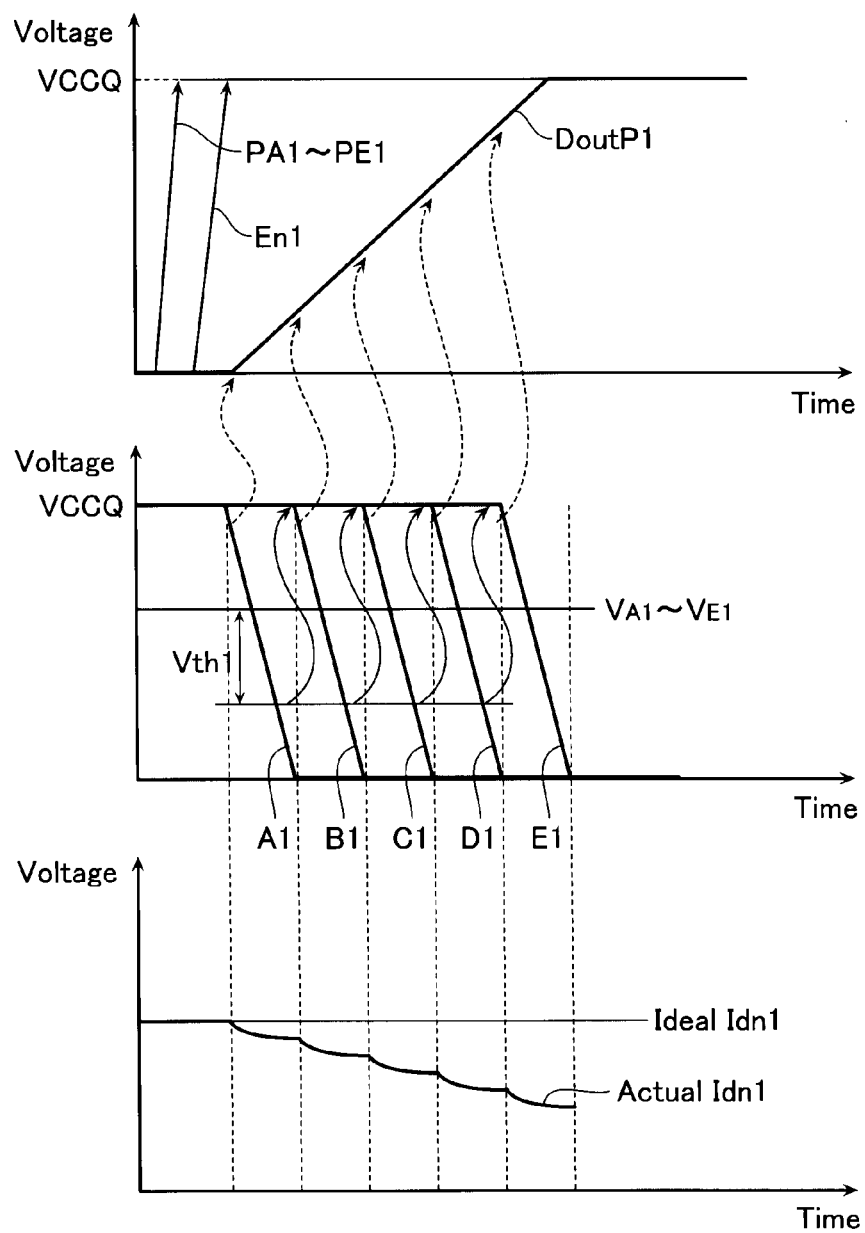
FIG. 18 is a waveform chart showing operation of the buffer circuit in accordance with the modified example 1 of the first embodiment of the present invention.

Lowering of the current Idn1 caused by coupling due to a sudden drop in voltage of nodes A1-E1 can also be suppressed by, for example, providing a large stabilizing capacitance C01 in the constant current circuit CC. However, providing a large stabilizing capacitance is an obstacle to speedy switching of the voltages VA1-VE1. It is thus difficult to avoid the above-described lowering in the current Idn1 in the context of providing an appropriate large stabilizing capacitance C01. That is, as nodes A1-E1 start to fall sequentially, the current Idn1 lowers further and further, rendering a constant current operation unachievable, whereby the voltages VA1-VE1 cannot be appropriately controlled, as shown in FIG. 18.

Figure 19:
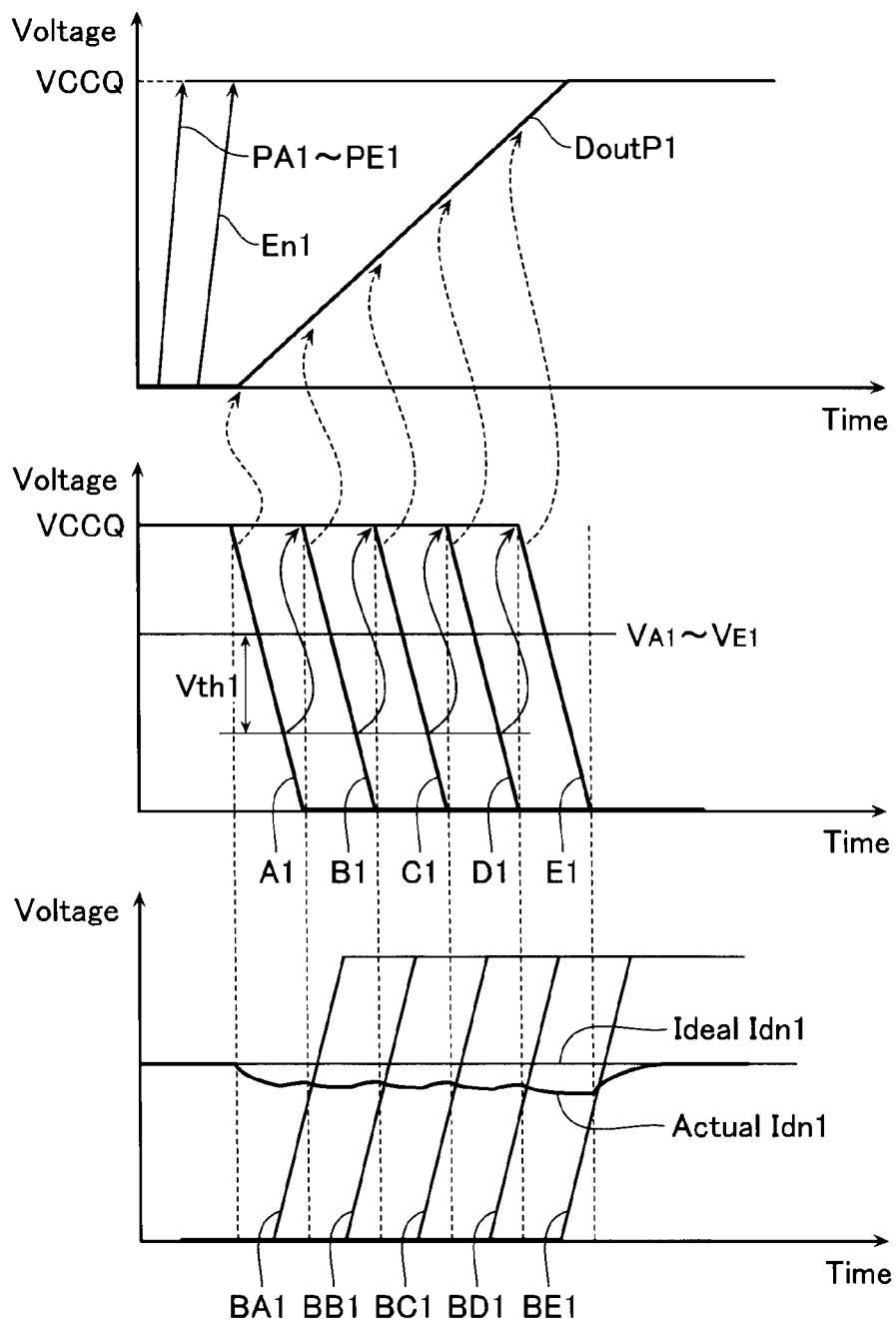
FIG. 19 is a waveform chart showing operation of the buffer circuit in accordance with the eighth embodiment of the present invention.

In contrast, providing the coupling circuit 801 such as in the present embodiment allows this kind of problem to be solved. That is, as shown in FIG. 19, when the voltage of nodes A1-E1 falls to the threshold voltage of the inverters IA1a-IE1a, the output signal of the inverters IA1a-IE1a (nodes BA1-BE1) switches from "L" to "H", whereby operation of the capacitors CA1-CE1 causes the voltage of the gates of the transistors TA1-TE1 to rise due to coupling. As a result, the aforementioned lowering of the current Idn1 caused by coupling due to a sudden drop in voltage of nodes A1-E1 can be increased again (pushed back). The current Idn1 lowered due to coupling with nodes A1-E1 can thus be increased again due to coupling of the capacitors CA1-CE1. Performing such an operation allows lowering of the current Idn1 overall to be considerably suppressed. Note that capacitance of the capacitors CA1-CE1 is desirably set substantially equal to gate capacitance of the transistors TA1-TE1. This allows the effect of coupling based on lowering of the potential of nodes A1-E1 to be substantially counteracted.

Ninth Embodiment

Figure 20:
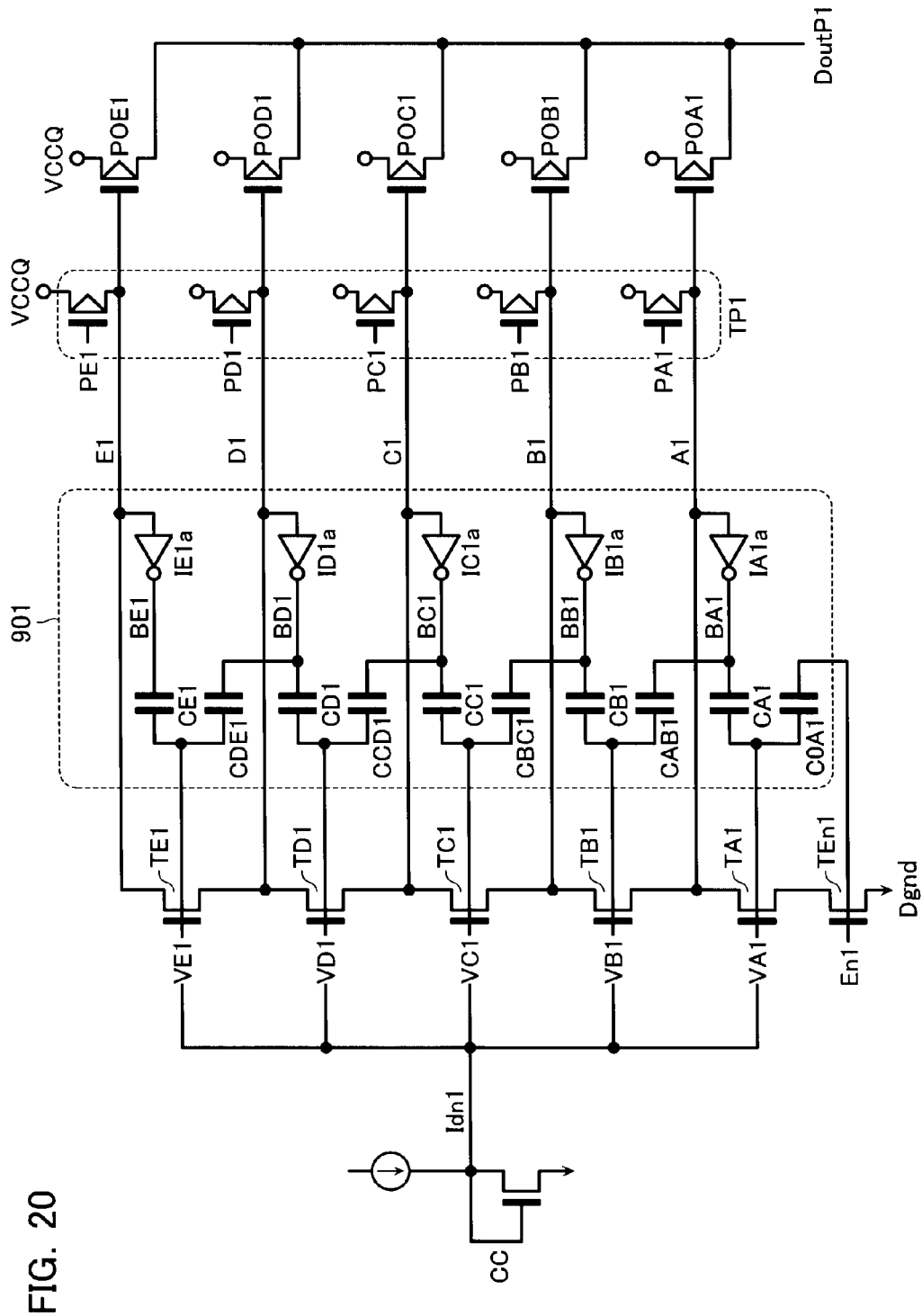
FIG. 20 is an equivalent circuit diagram of a buffer circuit in accordance with a ninth embodiment of the present invention.

Next, a buffer circuit in accordance with a ninth embodiment of the present invention is described with reference to FIG. 20. This ninth embodiment has a feature of comprising a coupling circuit 901, similarly to the eighth embodiment (FIG. 17). The coupling circuit 901 is provided with an object similar to that of the coupling circuit 801, and also has a function substantially similar to that of the coupling circuit 801, excluding points described hereafter. Note that in FIG. 20, configurative elements identical to those of FIG. 17 are assigned with symbols identical to those of FIG. 17, and detailed descriptions thereof are omitted.

The coupling circuit 901 differs from the coupling circuit 801 in having the output terminal of the inverters IA1a-IE1a (nodes BA1-BE1) connected to two of the capacitors. One of the two capacitors is capacitors CA1-CE1 similar to the capacitors in the coupling circuit 801, the other ends of these capacitors being connected to gates of the corresponding transistors TA1-TE1.

The other of the two capacitors, namely capacitors CAB1, CBC1, CCD1, and CDE1, have their other ends connected to gates of adjacent transistors TB1-TE1 (transistors to be subsequently turned on). Note that the inverter IE1a connected to node E1, which is most delayed in changing potential, has only one capacitor CE1 connected to its output terminal, and in this point, the coupling circuit 901 is similar to the coupling circuit 801. Furthermore, the capacitor C0A1, which has one end supplied with the trigger signal En1, has its other end connected to the gate of the transistor TA1, the transistor TA1 being first to be turned on. As a result, the voltage VA1 of the gate of the transistor TA1 is raised in advance due to coupling with the capacitor C0A1, prior to reduction in the current Idn1 caused by coupling due to lowering of the potential of node A1.

In the case of the aforementioned eighth embodiment, the current Idn1 is once reduced due to a sudden lowering in potential of nodes A1-E1, then subsequently increases due to operation of the capacitors CA1-CE1. However, the reduction amount cannot be recovered, and the current Idn1 gradually decreases.

Figure 21:
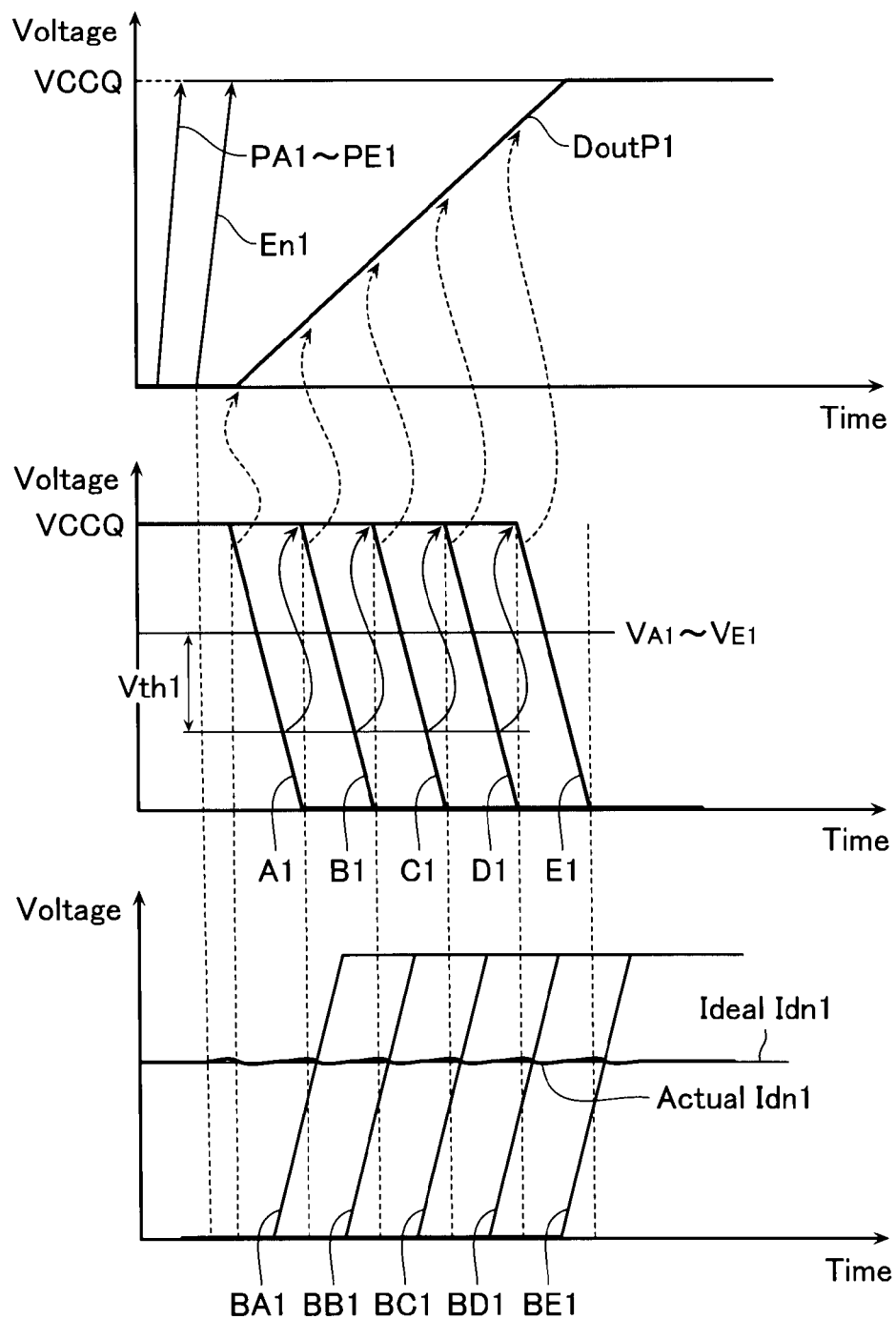
FIG. 21 is a waveform chart showing operation of the buffer circuit in accordance with the ninth embodiment of the present invention.

In contrast, in the case of the ninth embodiment, the output signals of each stage of the inverters IA1a-IE1a is supplied, via the capacitors, not only to the gate of the corresponding stage of the gate control transistors but also to the gates of the gate control transistors of stages above the corresponding stage (that are delayed in being turned on). Hence, in the ninth embodiment, the current Idn1 can be increased due to coupling of the capacitors CAB1, CBC1, CCD1, and CDE1, prior to decrease in the current Idn1. As a result, the degree of decrease in the current Idn1 can be considerably reduced compared with the eighth embodiment (refer to FIG. 21).

Modified Example of Ninth Embodiment

Figure 22:
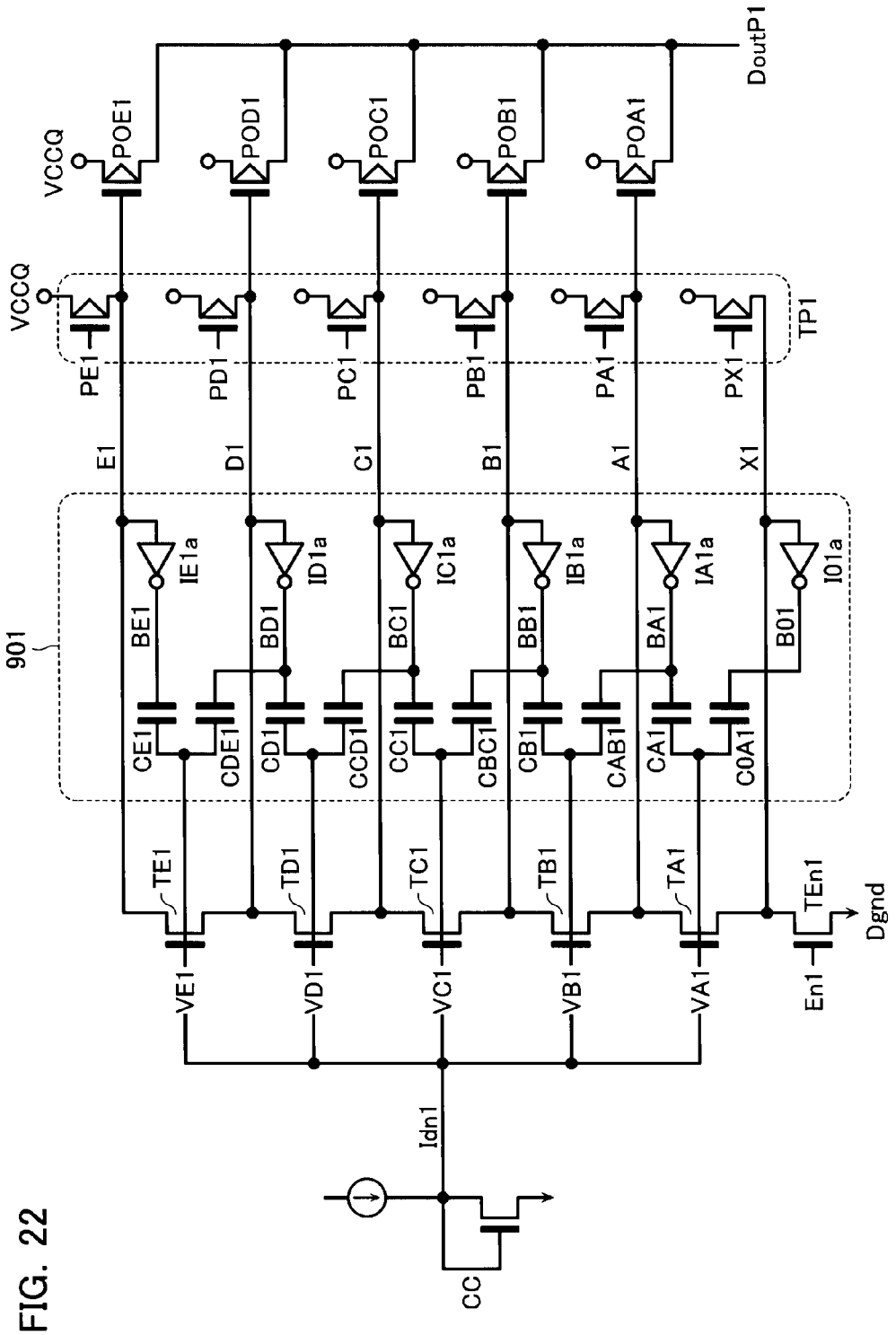
FIG. 22 is an equivalent circuit diagram of a buffer circuit in accordance with a modified example of the ninth embodiment of the present invention.

FIG. 22 is an equivalent circuit diagram of a buffer circuit in accordance with a modified example of the ninth embodiment of the present invention. FIG. 22 differs from FIG. 20 in having the drain of the trigger transistor TEn1 (node X1) charged by a pre-charge transistor TP1, and further, in having the input terminal of an inverter I01a connected to this node X1. Moreover, this inverter I01a has its output terminal (node B01) connected to one end of the capacitor C0A1.

This configuration causes the rise in potential of the gate of the transistor TA1 due to the capacitor C0A1 to occur after the output signal of the inverter I01a (node B01) has inverted to "H" as a result of node X1 being discharged by turning on the transistor TEn1. Consequently, timing of uplift of the current Idn1 in the transistor TA1 can be delayed compared with the case of FIG. 21.

Tenth Embodiment

Figure 23:
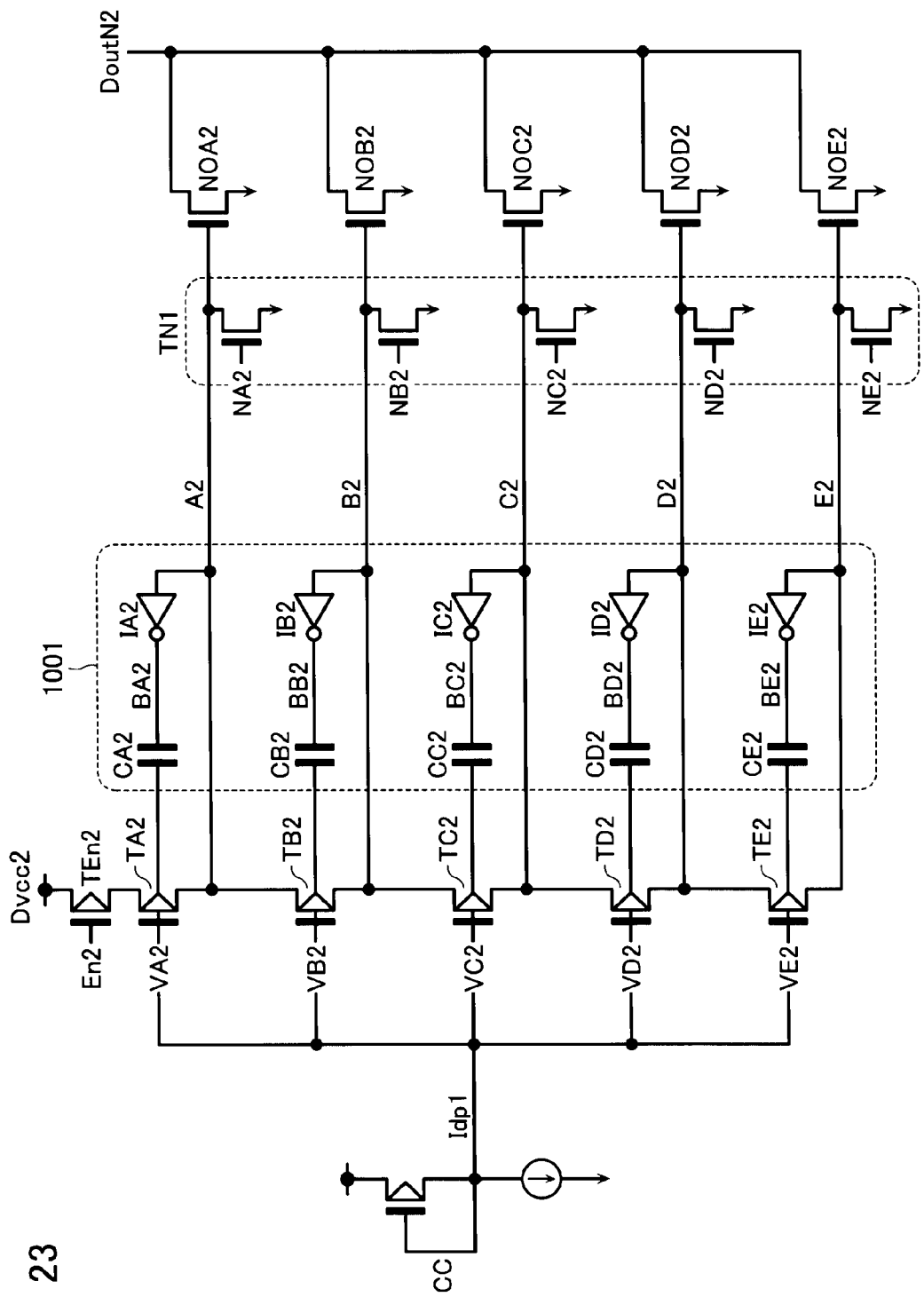
FIG. 23 is an equivalent circuit diagram of a buffer circuit in accordance with a tenth embodiment of the present invention.

Next, a buffer circuit in accordance with a tenth embodiment of the present invention is described with reference to FIG. 23. This tenth embodiment has a feature of including a coupling circuit 1001 similar to that of FIG. 17 in the circuit of FIG. 7.

One example of this coupling circuit 1001 comprises inverters IA2-IE2 and capacitors CA2-CE2. The inverters IA2-IE2 have their input terminals connected to nodes A2-E2, and their output terminals (nodes BA2-BE2) connected to one ends of the capacitors CA2-CE2. In addition, the capacitors CA2-CE2 have their other ends connected to gates of the gate control transistors TA2-TE2.

When there is not such coupling circuit 1001, the rise in a current Idp1 caused by coupling due to a sudden rise in voltage of nodes A2-E2 causes a constant current operation to become unachievable, whereby the voltages VA2-VE2 cannot be appropriately controlled.

Figure 24:
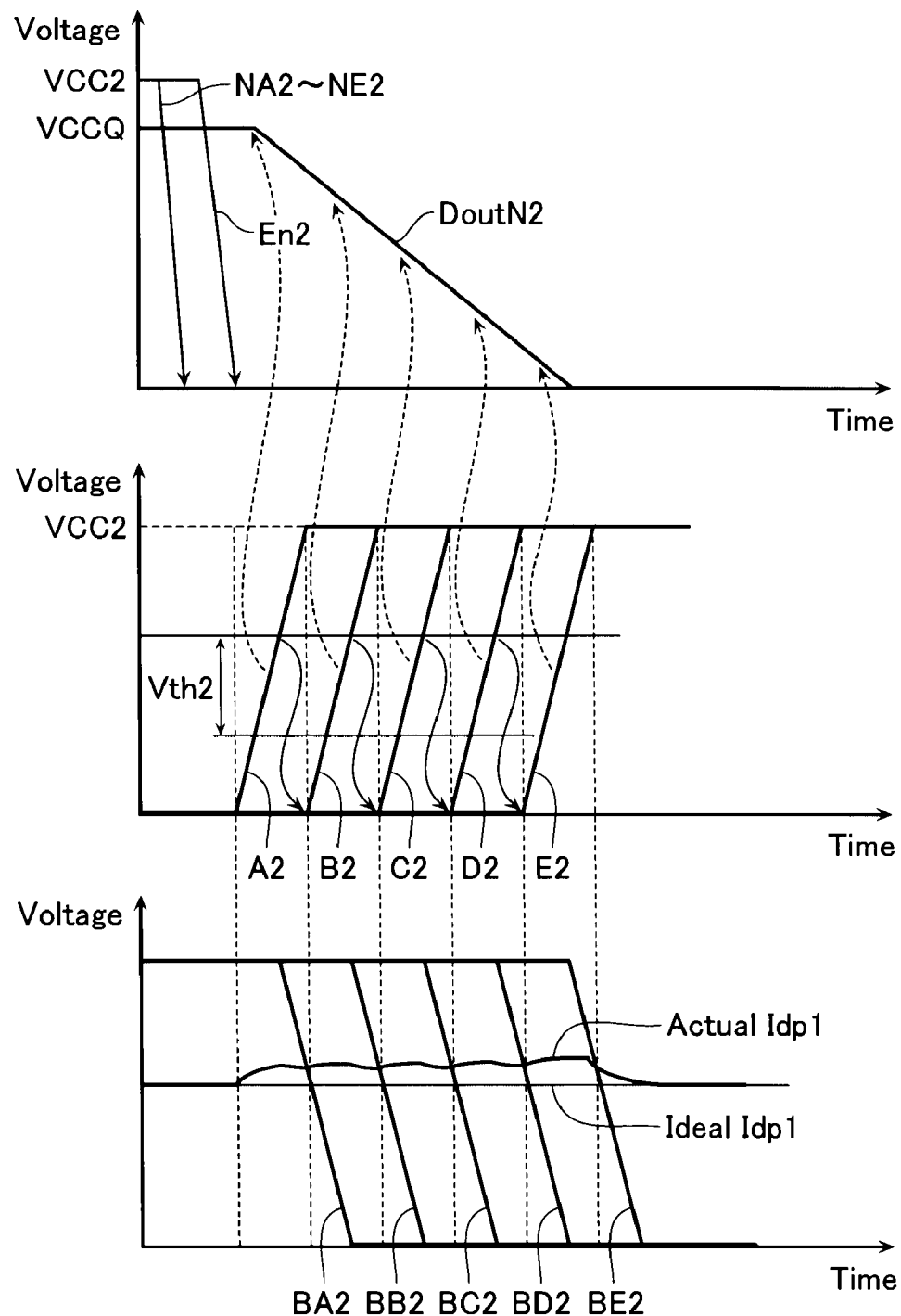
FIG. 24 is a waveform chart showing operation of the buffer circuit in accordance with the tenth embodiment of the present invention.

In contrast, providing the coupling circuit 1001 such as in the present embodiment allows this kind of problem to be solved. That is, when the voltage of nodes A2-E2 rises to the threshold voltage of the inverters IA2-IE2, the output signal of the inverters IA2-IE2 (nodes BA2-BE2) switches from "H" to "L", whereby operation of the capacitors CA2-CE2 causes the voltage of the gates of the transistors TA2-TE2 to fall due to coupling. As a result, the aforementioned rise in the current Idp1 caused by coupling due to a sudden rise in voltage of nodes A2-E2 can be decreased again (pushed back) (refer to FIG. 24). The current Idp1 increased due to coupling with nodes A2-E2 can thus be decreased again due to coupling of the capacitors CA2-CE2. Hence, constant current operation can be maintained. Note that capacitance of the capacitors CA2-0E2 is desirably set substantially equal to gate capacitance of the transistors TA2-TE2. This allows the effect of coupling based on change in the potential of nodes A2-E2 to be substantially counteracted.

Eleventh Embodiment

Figure 25:
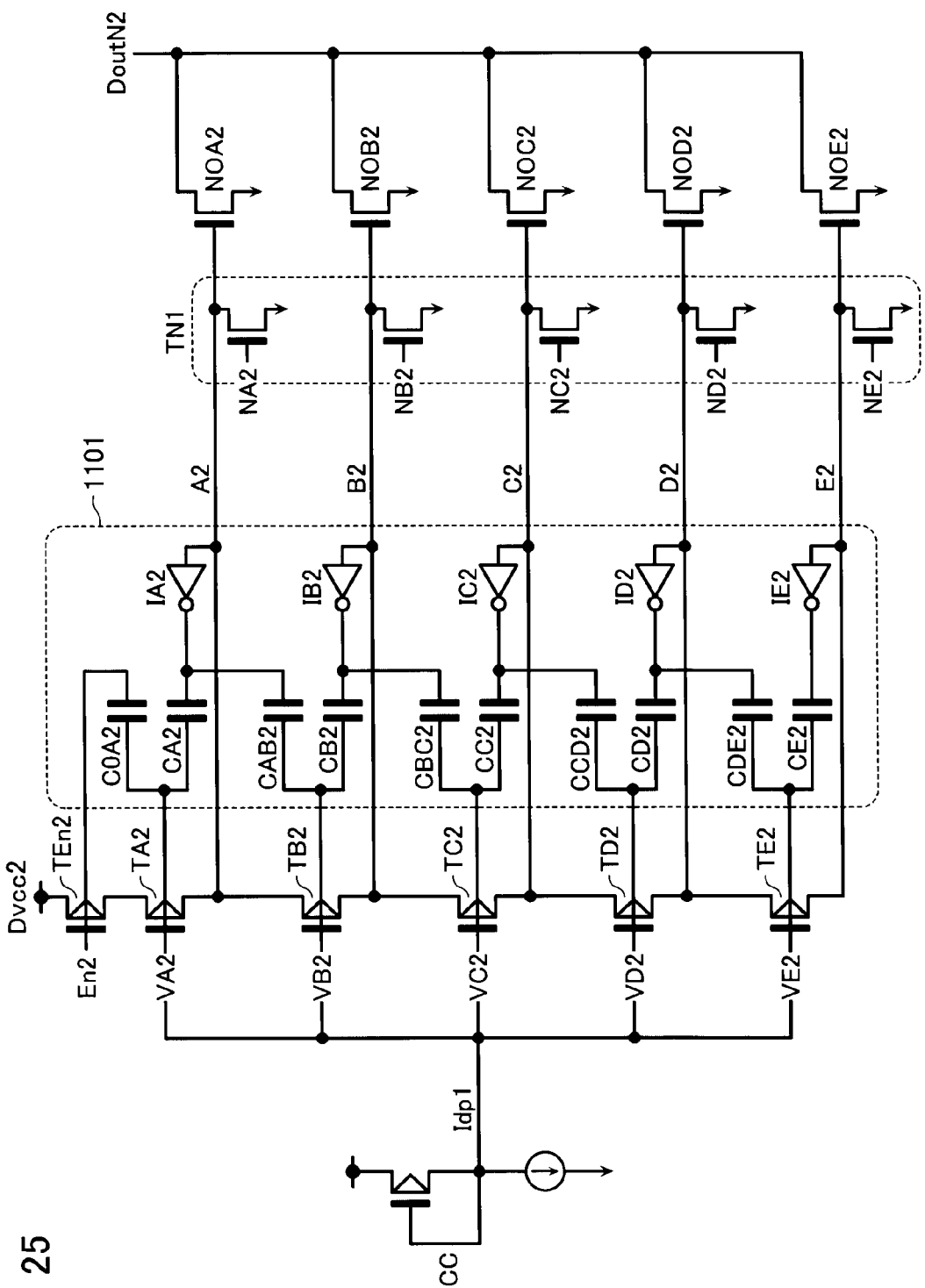
FIG. 25 is an equivalent circuit diagram of a buffer circuit in accordance with an eleventh embodiment of the present invention.

Next, a buffer circuit in accordance with an eleventh embodiment of the present invention is described with reference to FIG. 25. This eleventh embodiment has a coupling circuit 1101 similar to the coupling circuit 901 of the ninth embodiment (FIG. 20) provided to the circuit of FIG. 7. The configuration and operation of the eleventh embodiment are both substantially identical to those of the ninth embodiment.

The coupling circuit 1101 has two capacitors connected to the output terminal of the inverters IA2-IE2, similarly to the coupling circuit 901. One of the two capacitors is capacitors CA2-CE2 which are similar to the capacitors CA1-CE1 in the coupling circuit 901, the other ends of these capacitors being connected to gates of the corresponding transistors TA2-TE2. The other of the two capacitors, namely capacitors CAB2, CBC2, CCD2, and CDE2, have their other ends connected to gates of adjacent transistors TB2-TE2. Note that the inverter IE2 connected to node E2, which is most delayed in changing potential, has only one capacitor CE2 connected to its output terminal.

Furthermore, the capacitor C0A2, which has one end supplied with the trigger signal En2, has its other end connected to the gate of the transistor TA2, the transistor TA2 being first to be turned on. As a result, the voltage VA2 of the gate of the transistor TA2 is lowered in advance due to coupling with the capacitor C0A2, prior to increase in the current Idp1 caused by coupling due to the rise in potential of node A2.

Figure 26:
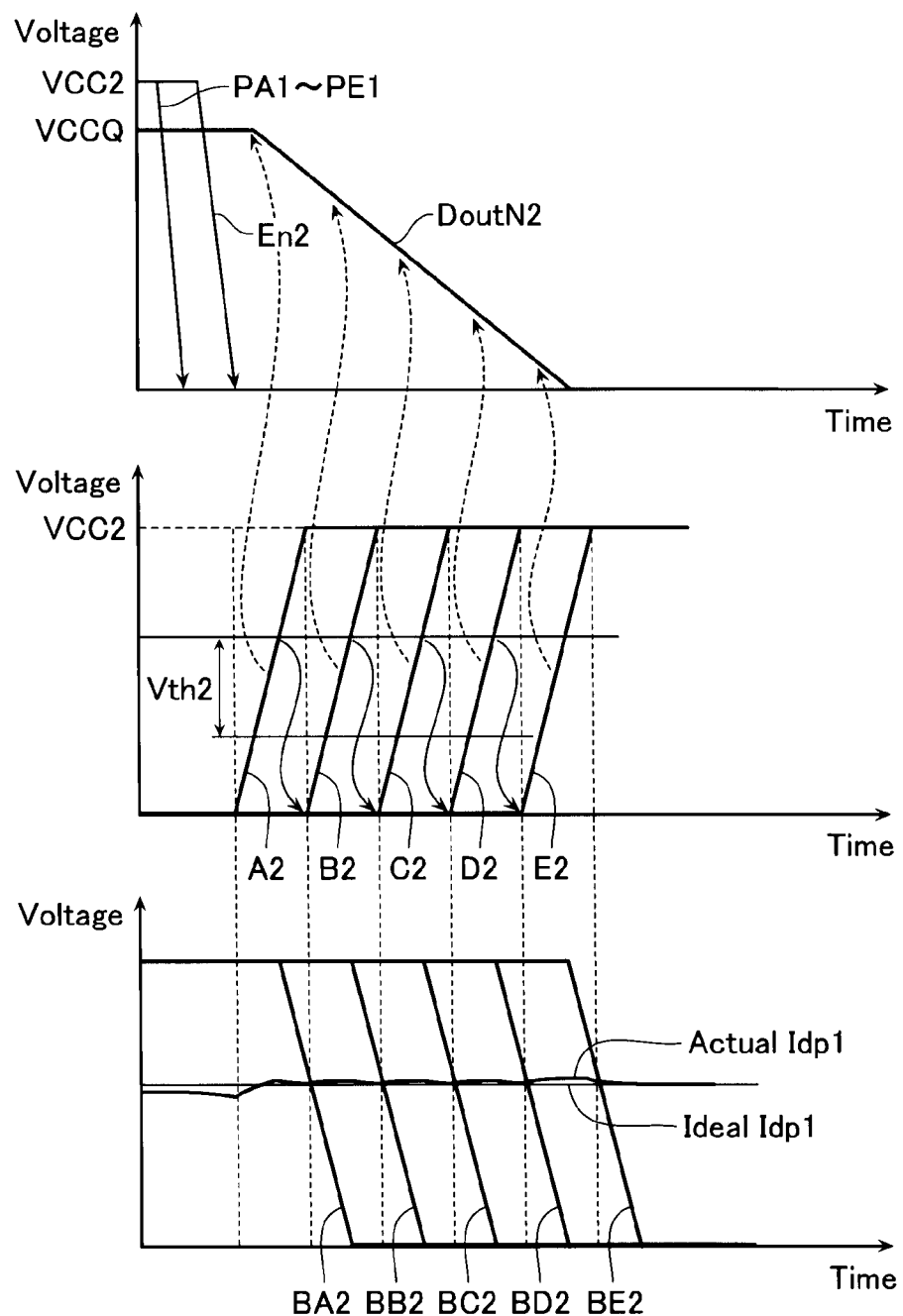
FIG. 26 is a waveform chart showing operation of the buffer circuit in accordance with the eleventh embodiment of the present invention.

In the case of the eleventh embodiment, the output signals of each stage of the inverters IA2-IE2 is supplied, via the capacitors, not only to the gate of the corresponding stage of the gate control transistors but also to the gates of the gate control transistors of stages below the corresponding stage (that are delayed in being turned on). Hence, in the eleventh embodiment, the current Idp1 can be decreased due to coupling of the capacitors CAB2, CBC2, CCD2, and CDE2, prior to increase in the current Idp1. As a result, the degree of increase in the current Idp1 can be considerably reduced (refer to FIG. 26).

Modified Example of Eleventh Embodiment

Figure 27:
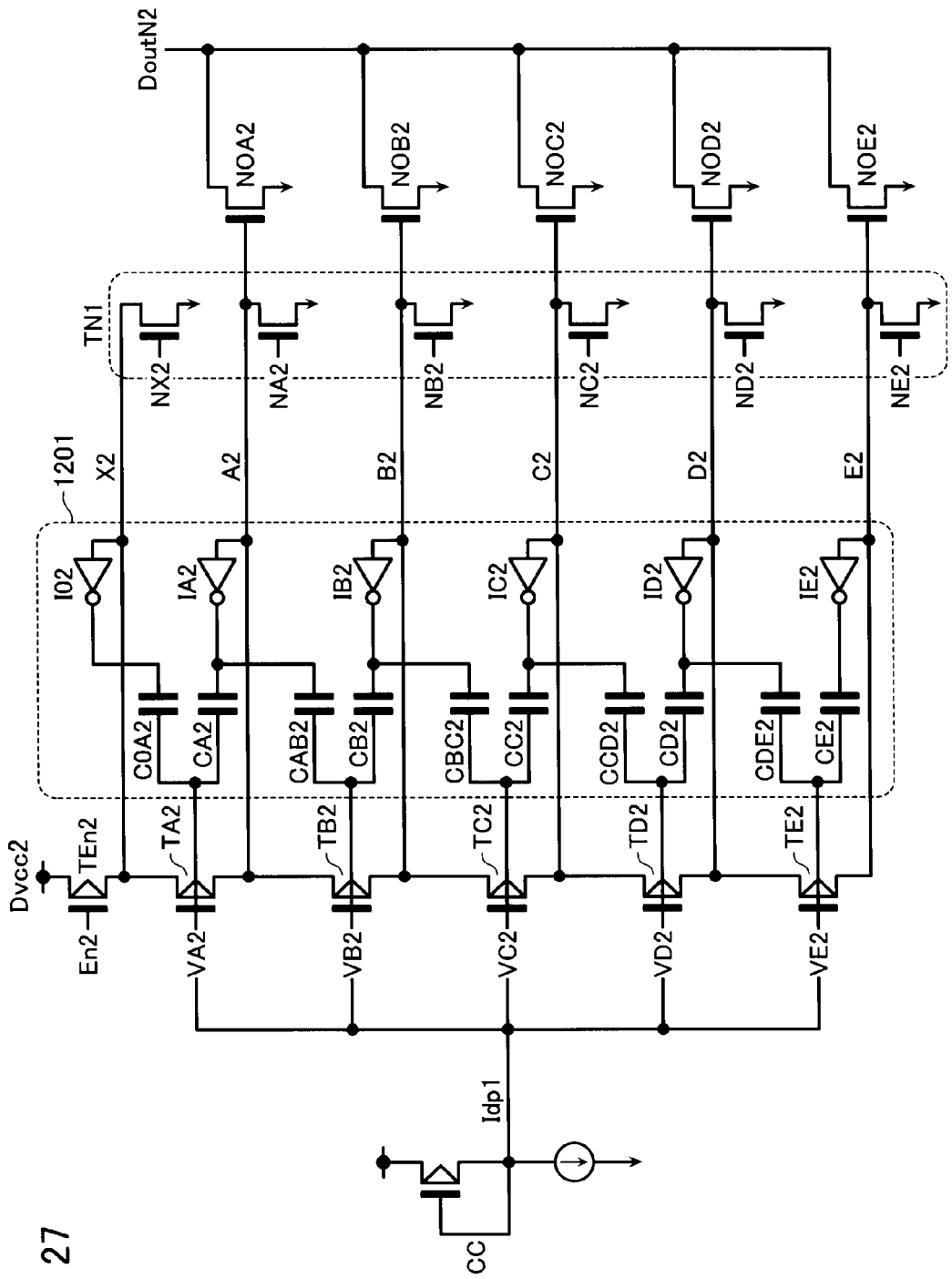
FIG. 27 is an equivalent circuit diagram of a buffer circuit in accordance with a modified example of the eleventh embodiment of the present invention.

FIG. 27 is an equivalent circuit diagram of a buffer circuit in accordance with a modified example of the eleventh embodiment of the present invention. FIG. 27 differs from FIG. 25 in having the drain of the trigger transistor TEn2 (node X2) charged by a pre-charge transistor TN1, and further, in having the input terminal of an inverter I02 connected to this node X2. Moreover, this inverter I02 has its output terminal connected to one end of the capacitor C0A2.

This configuration causes the rise in potential of the gate of the transistor TA2 due to the capacitor C0A2 to occur after the output signal of the inverter I02 has inverted to "L" as a result of node X2 being charged by turning on the transistor TEn1. Consequently, timing of pulling down of the current Idp1 in the transistor TA2 can be delayed compared with the case of FIG. 25.

Twelfth Embodiment

Figure 28:
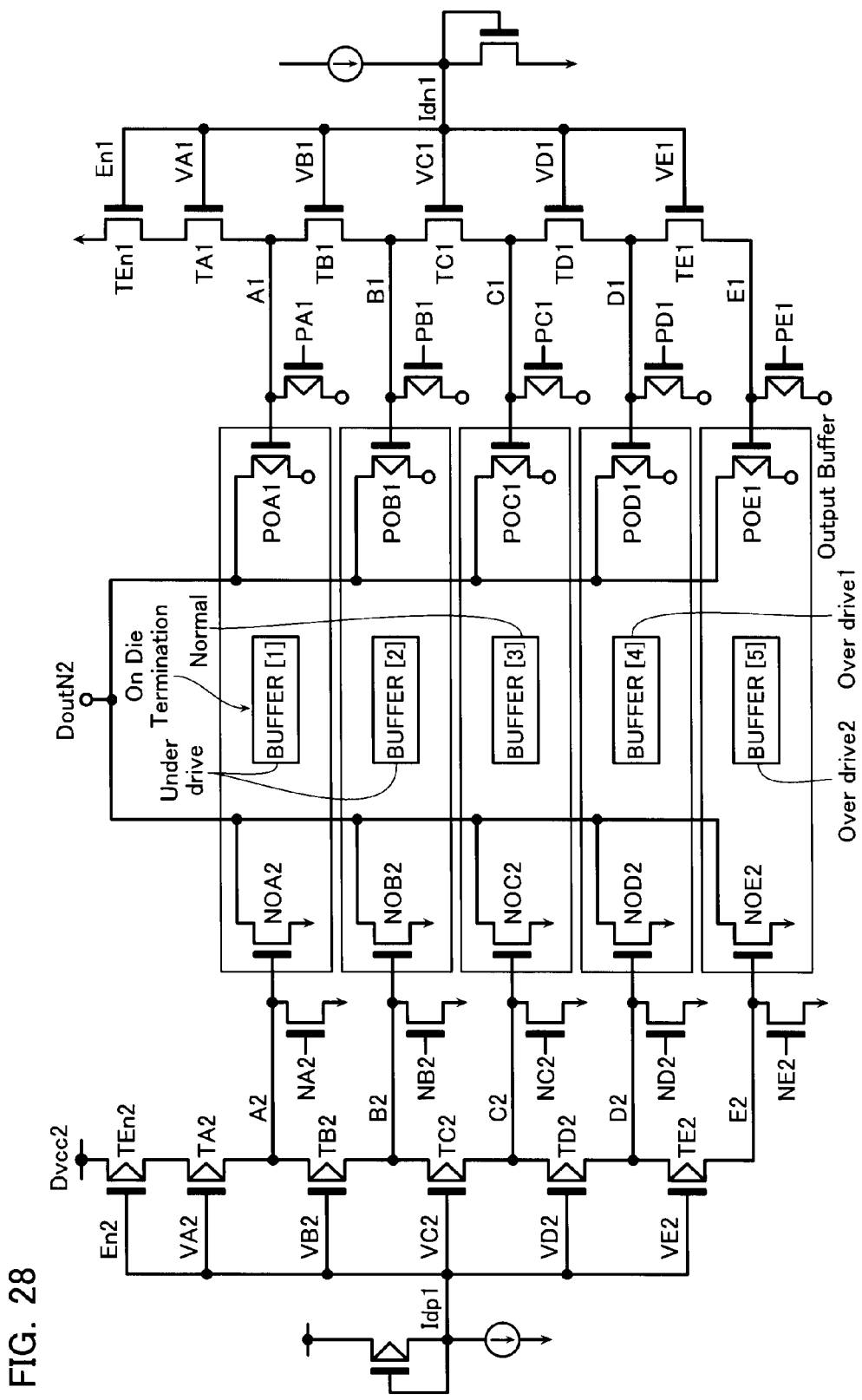
FIG. 28 is an equivalent circuit diagram of a buffer circuit in accordance with a twelfth embodiment of the present invention.

Next, a buffer circuit in accordance with a twelfth embodiment of the present invention is described with reference to FIG. 28-29D. This twelfth embodiment is similar in configuration to the third embodiment, being configured as a CMOS output buffer circuit (FIG. 9) combining the PMOS output buffer circuit of the first embodiment (FIG. 1) and the NMOS output buffer circuit of the second embodiment (FIG. 5). However, the CMOS output buffer circuit of this embodiment differs from that of the third embodiment in being used also as a terminating resistor of an input buffer circuit as shown in FIGS. 29C and 29D. In FIGS. 29C and 29D, a transmission path DQ is connected to an output terminal Dout of the CMOS output buffer circuit. In addition, the output terminal Dout of the CMOS output buffer circuit is connected to an input terminal of an input buffer circuit.

As an example of the case of being used as an output buffer circuit, the CMOS output buffer circuit of the present embodiment can be switched between a low drive state (Under Drive) in which only buffer circuits BUFFER [1] and [2] are driven, a normal drive state (Normal) in which buffer circuits BUFFER [1]-[3] are driven, a first high drive state (Over Drive 1) in which buffer circuits BUFFER [1]-[4] are driven, and a second high drive state (Over Drive 2) in which all buffer circuits BUFFER [1]-[5] are driven.

In contrast, in the case that the buffer circuit of the present embodiment is used as a terminating resistor of an input buffer circuit as shown in FIGS. 29C and 29D, the buffer circuit BUFFER [1] is operated as a terminating resistor.

Figure 29A:
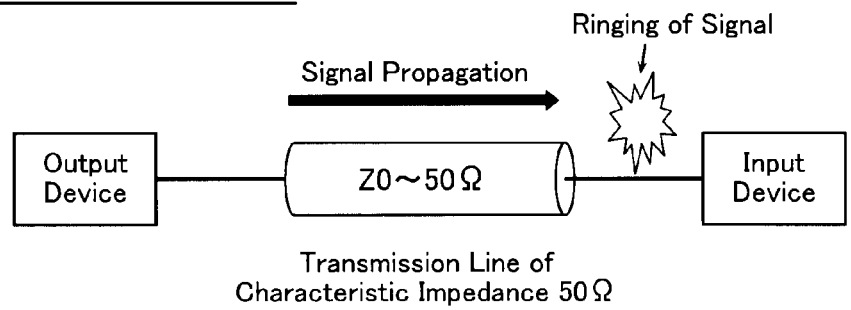
FIG. 29A is a conceptual diagram explaining ringing of a signal occurring at an input terminal.
Figure 29B:
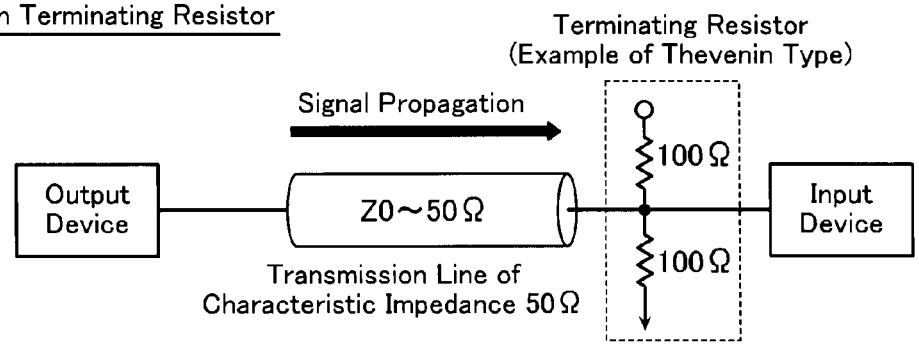
FIG. 29B is a conceptual diagram explaining an effect of a terminating resistor.
Figure 29C:
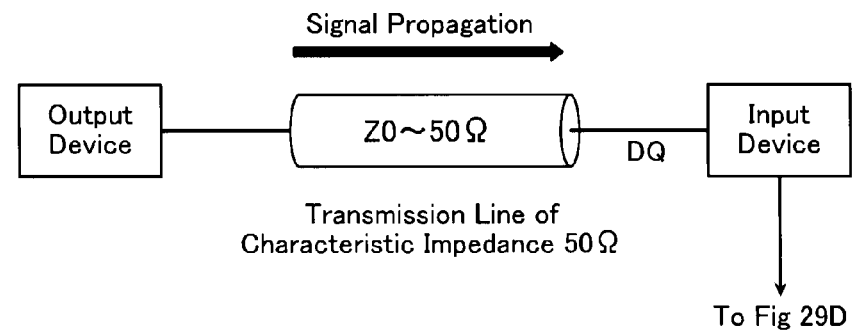
FIG. 29C is a conceptual diagram of the buffer circuit in accordance with the twelfth embodiment of the present invention.
Figure 29D:
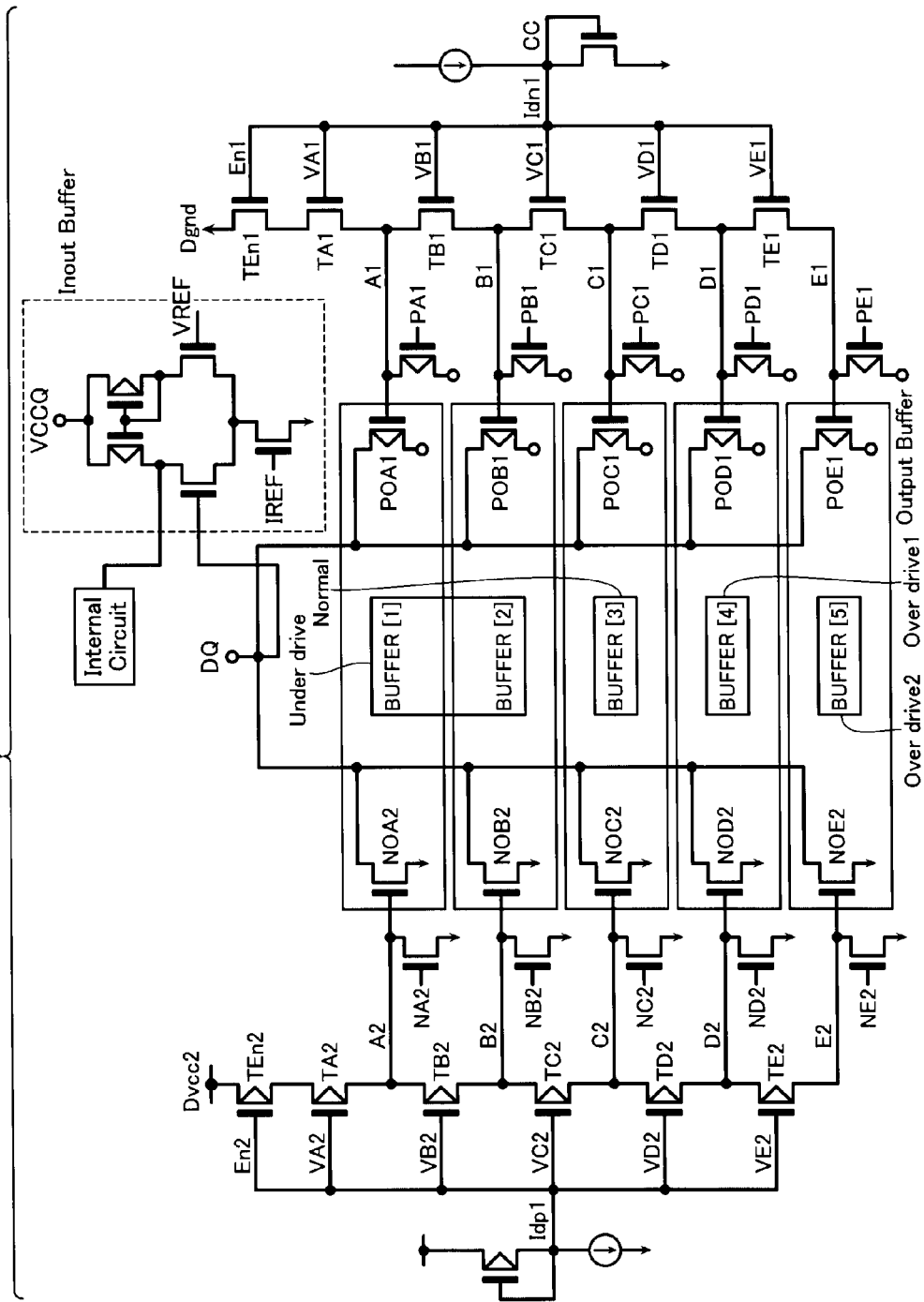
FIG. 29D is an equivalent circuit diagram of the buffer circuit in accordance with the twelfth embodiment of the present invention.

When operation of the interface of the device becomes high speed, signal propagation becomes a wave, and ringing of the signal occurs at the input terminal of the circuit where impedance breaks down between the transmission line and the input terminal, thereby lowering quality of the transmission signal (refer to FIG. 29A). Generally, as a means for reducing such ringing of the signal, a method is adopted in which the ringing is absorbed by inserting in a terminal of the transmission line a resistance of substantially the same value as the transmission line and connecting this resistance to a fixed potential (for example, the power supply voltage or the ground voltage), as shown in FIG. 29B. This causes the power consumption to increase, but enables a high speed interface to be executed while avoiding effects of noise. Such a resistance element is often installed outside the chip, but, in view of component cost and substrate area, it is likeable to adopt an intra-chip terminating resistor (ODT: On Die Termination) where the terminating resistor is provided inside the chip.

This kind of intra-chip terminating resistor must be blocked during data output, and, moreover, precision of the resistance value is required. As a result, the intra-chip terminating resistor, in addition to having the configuration of an output buffer circuit, must further be configured by a switching element and resistance element connected only when the intra-chip terminating resistor is used as an input buffer circuit. However, there is a drawback that since such a switching element must have its impedance lowered enough to prevent any effect on a later resistance value, the size of the element increases, whereby PIN capacitance of the device, originally desired to be minimized, is made larger. This output buffer circuit (input/output buffer circuit) of the twelfth embodiment uses the transistors in the buffer circuit BUFFER [1] as the intra-chip terminating resistor, the buffer circuit BUFFER [1] being a portion of the configurative elements of the output buffer circuit. Hence, the original problem of an increase in PIN capacitance due to the switching element can be avoided. Control of the value of the resistance is enabled by employing a means for switching drive capacity of the output buffer circuit.

As shown in FIG. 29A, an example is considered of the case where a signal transmitted along a transmission line having a characteristic impedance of 50Ω is inputted to an input device via the CMOS buffer circuit of the present embodiment. The case is considered where the resistances of the output transistors POA1-POE1 and NOA2-NOE2 set to an on state are 100Ω, respectively. In this case, as shown in FIG. 29B, ringing of the signal can be counteracted by forming two terminating resistors of 100Ω between the power supply voltage and the ground terminal to sandwich the transmission line.

Thus, in the case of employing the output transistors in the CMOS buffer circuit of FIG. 29D as the terminating resistor of the input buffer circuit, the output transistors POA1 and NOA2 of buffer circuit BUFFER [1] are turned on and caused to function, respectively, as resistances of 100Ω. The two transistors function overall as a terminating resistor of 50Ω.

On the other hand, when the buffer circuit of FIG. 29D functions as an output buffer circuit and the output signal is "H", the output transistors POA1 and POB1 are turned on, whereby a drive capacity is set by combined resistance value of the two resistances of 50Ω. Similarly, if the output signal is "L", the output transistors NOA2 and NOB2 are turned on, whereby a drive capacity is set similarly by combined resistance value of the two resistances of 50Ω.

Thirteenth Embodiment

Figure 30:
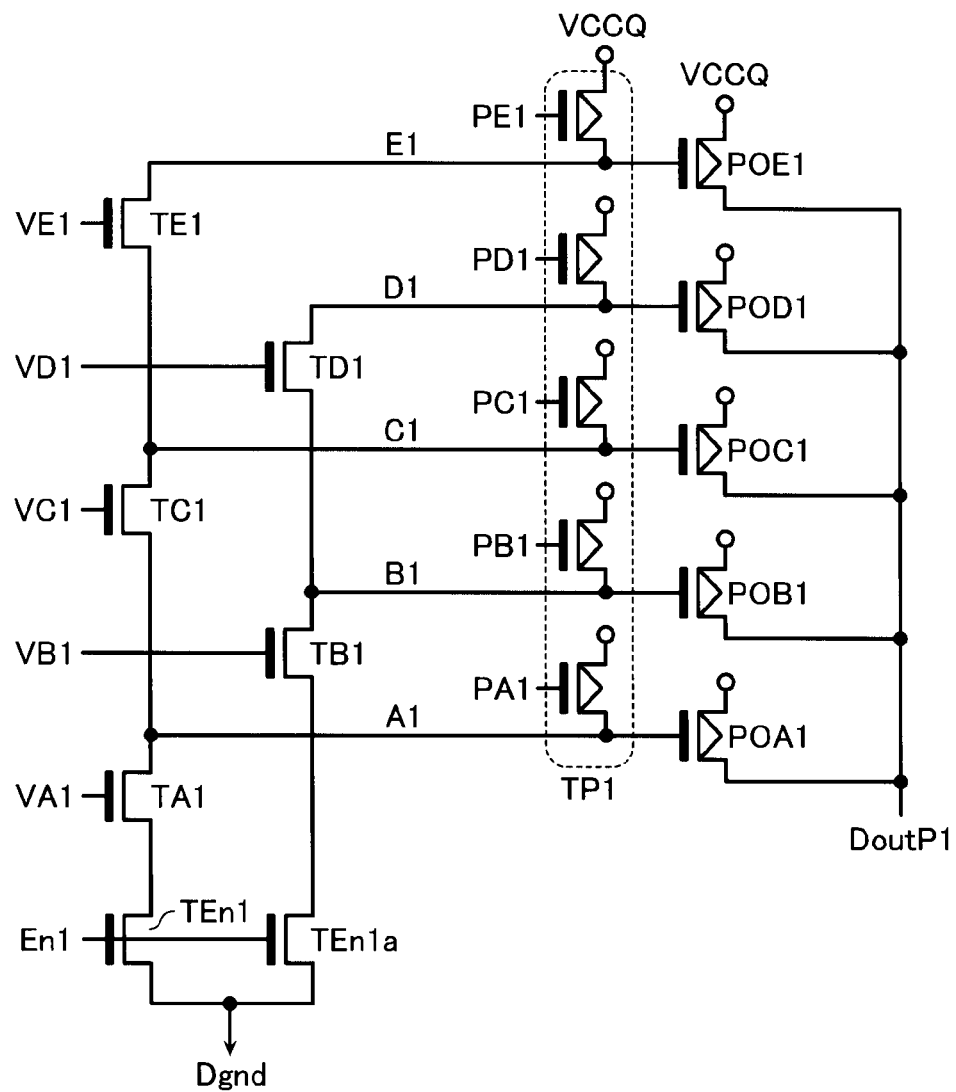
FIG. 30 is an equivalent circuit diagram of a buffer circuit in accordance with a thirteenth embodiment of the present invention.

Next, an output buffer circuit in accordance with a thirteenth embodiment of the present invention is described with reference to FIG. 30. Note that configurative elements identical to those of FIG. 1 are assigned with identical symbols, and detailed descriptions thereof are omitted.

This thirteenth embodiment differs from the first embodiment in connection of the gate control transistors TA1-TE1. The transistors each have their drains connected to respective nodes A1-E1, and in this respect the thirteenth embodiment is similar to the first embodiment (FIG. 1). However, in the first embodiment (FIG. 1), the gate control transistors TA1-TE1 are configured to be all connected in series in one column. In contrast, in the present embodiment, the gate control transistors TA1, TC1, and TE1 are connected in series to form a first series circuit (first gate control transistor group), while the gate control transistors TB1 and TD1 are connected in series to form a second series circuit (second gate control transistor group), whereby a total of two columns of series circuits are provided.

Figure 31:
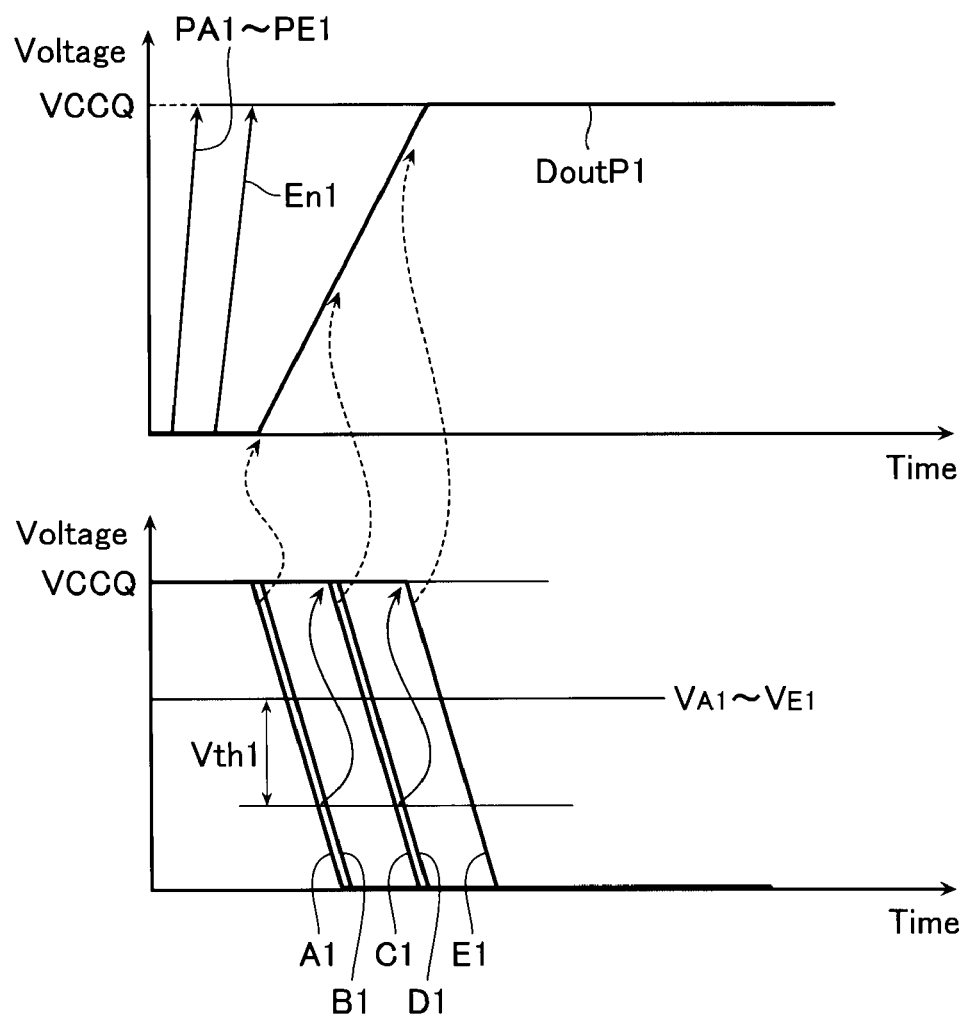
FIG. 31 is a waveform chart showing operation of the buffer circuit in accordance with the thirteenth embodiment of the present invention.

When the gate control transistors TA1-TE1 are connected in series in two columns as in the present embodiment, nodes A1 and B1 start discharging substantially simultaneously, and nodes C1 and D1 also start discharging substantially simultaneously (refer to FIG. 31). Thus, the slew rate of the output signal of the output terminal DoutP1 can be significantly increased.

Fourteenth Embodiment

Figure 32:
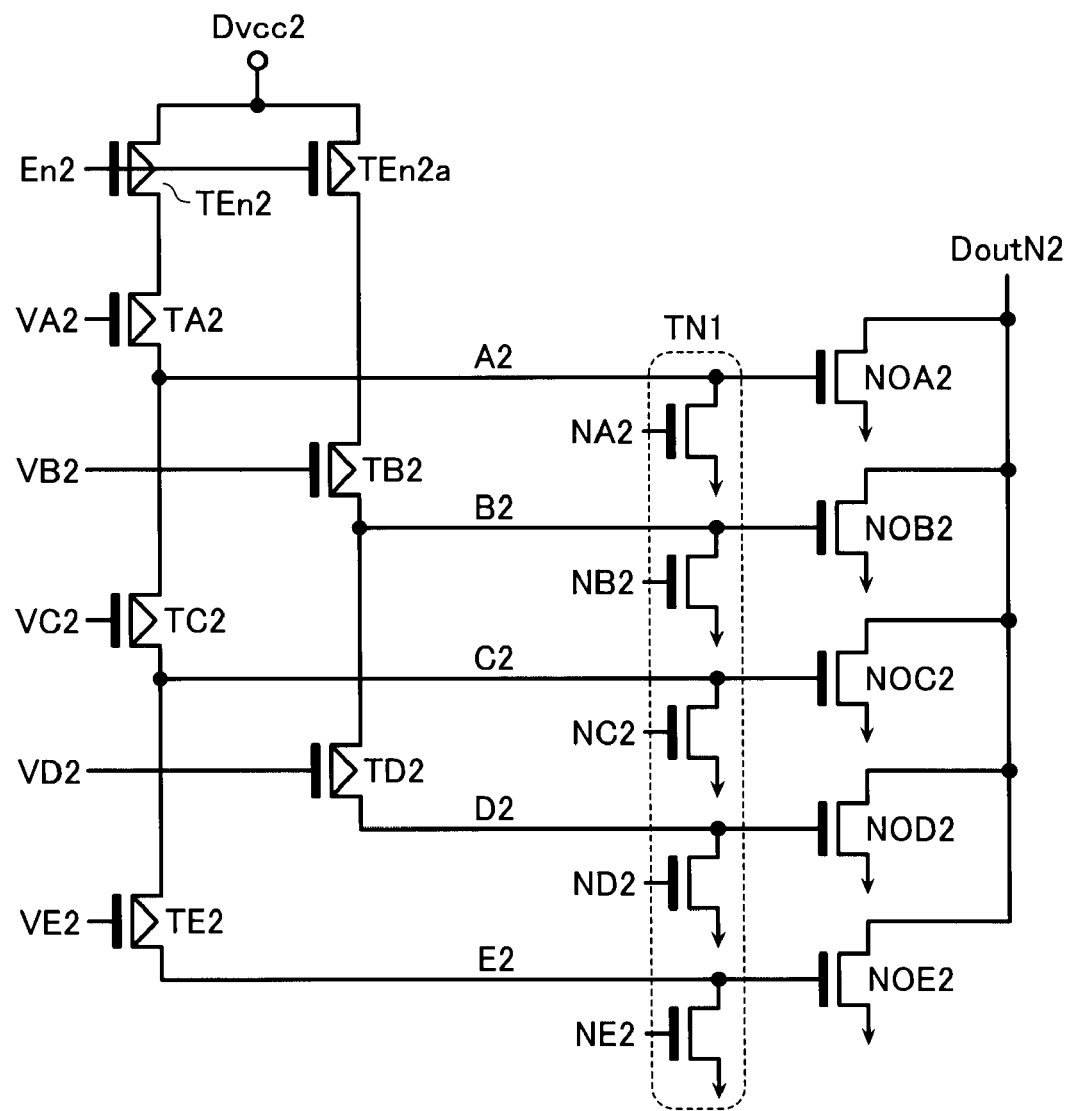
FIG. 32 is an equivalent circuit diagram of a buffer circuit in accordance with a fourteenth embodiment of the present invention.

Next, an output buffer circuit in accordance with a fourteenth embodiment of the present invention is described with reference to FIG. 32. This fourteenth embodiment relates to an NMOS output buffer similarly to the second embodiment (FIG. 5), and is identical to the second embodiment (FIG. 5) regarding configurations of the output transistors NOA2-NOE2 and pre-charge transistors TN1. Note that in FIG. 32, configurative elements identical to those of FIG. 5 are assigned with symbols identical to those of FIG. 5, and detailed descriptions thereof are omitted.

Figure 33:
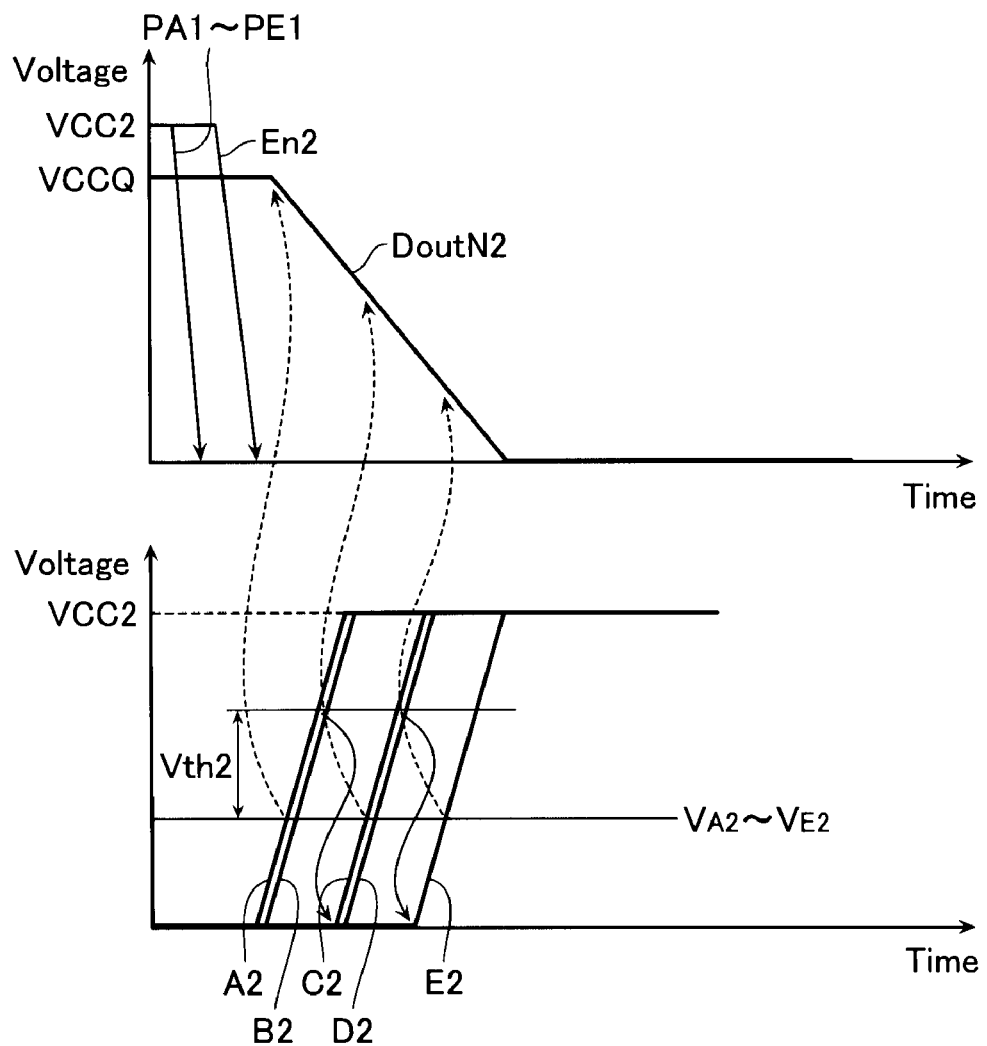
FIG. 33 is a waveform chart showing operation of the buffer circuit in accordance with the fourteenth embodiment of the present invention.

This fourteenth embodiment differs from the second embodiment (FIG. 5) in connection of the gate control transistors TA2-TE2. The transistors each have their drains connected to respective nodes A2-E2, and in this respect the fourteenth embodiment is similar to the second embodiment (FIG. 5). However, in the second embodiment (FIG. 5), the gate control transistors TA2-TE2 are all connected in series. In contrast, in the present embodiment, the gate control transistors TA2, TC2, and TE2 are connected in series, and the gate control transistors TB2 and TD2 are connected in series, whereby a total of two columns of series connections are configured. In this respect, the fourteenth embodiment closely resembles the thirteenth embodiment. This fourteenth embodiment also displays similar advantages to the thirteenth embodiment, as shown in FIG. 33.

Fifteenth Embodiment

Figure 34:
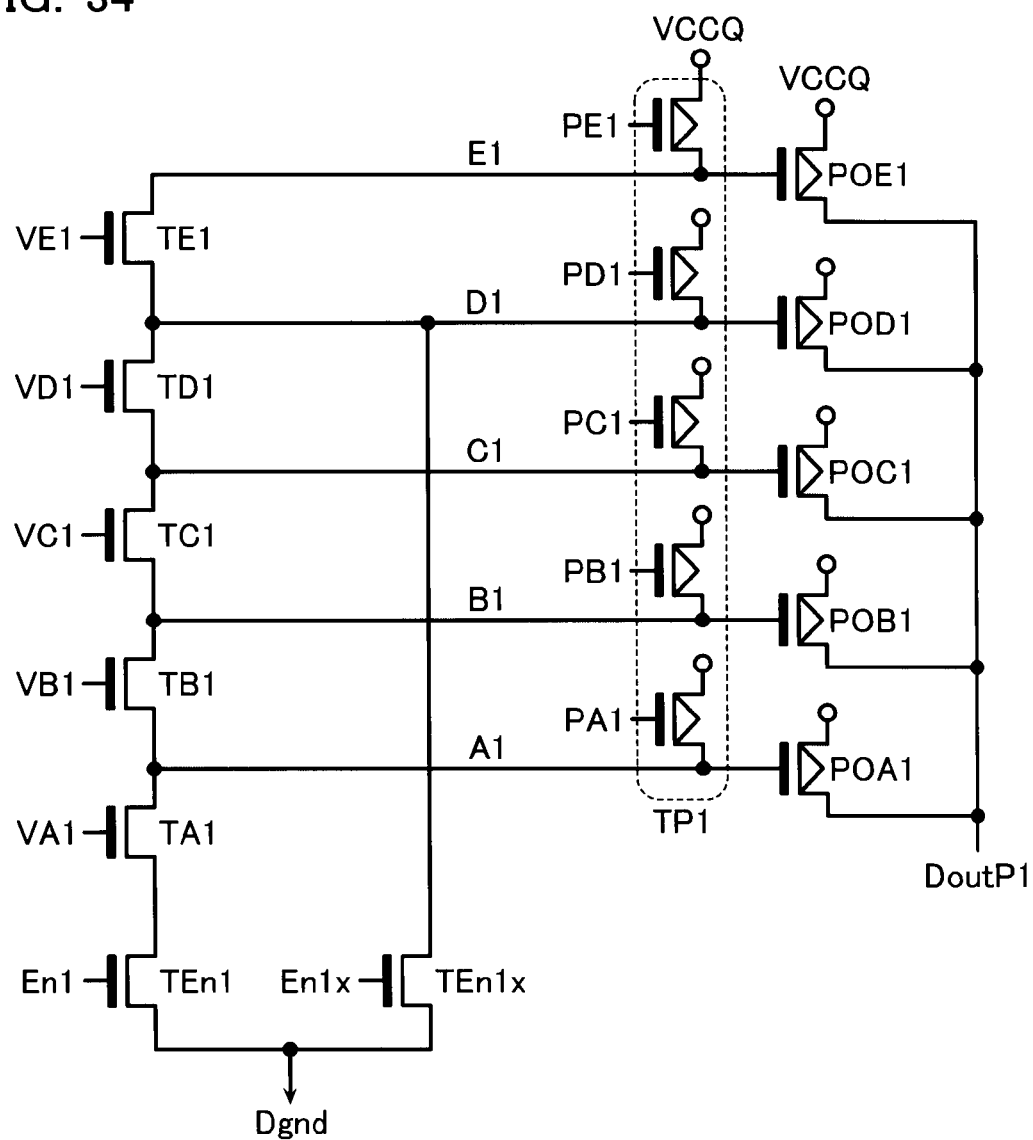
FIG. 34 is an equivalent circuit diagram of a buffer circuit in accordance with a fifteenth embodiment of the present invention.

Next, an output buffer circuit in accordance with a fifteenth embodiment of the present invention is described with reference to FIG. 34. Note that in FIG. 34, configurative elements identical to those of FIG. 1 are assigned with symbols identical to those of FIG. 1, and detailed descriptions thereof are omitted.

This fifteenth embodiment has a discharge-assisting transistor TEn1x further added to the circuit of the first embodiment (FIG. 1). This discharge-assisting transistor TEn1x has its drain connected to node D1, its source connected to the ground terminal Dgnd, and, furthermore, has its gate applied with a trigger signal En1x which rises to "H" simultaneously with the trigger signal En1.

Figure 35:
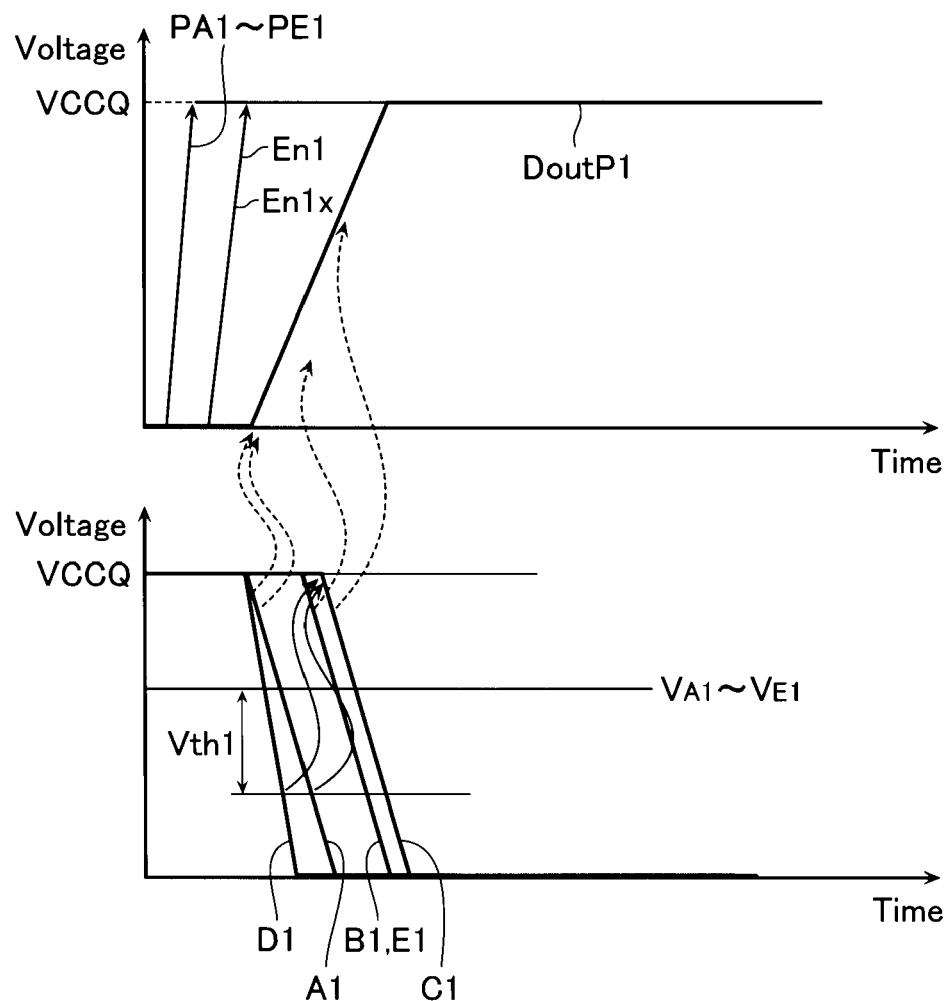
FIG. 35 is a waveform chart showing operation of the buffer circuit in accordance with the fifteenth embodiment of the present invention.

As shown in FIG. 35, this configuration causes node D1 of the nodes A1-E1 to start discharging first, followed by node A1 starting discharging, and then nodes B1, C1, and E1 starting discharging substantially simultaneously. Consequently, the slew rate of the output signal of the output terminal DoutP1 is increased.

In this fifteenth embodiment, both an output signal of large slew rate and an output signal of small slew rate are easily fulfilled. That is, when a user requires a large slew rate, the signals En1 and En1x need only be raised substantially simultaneously, and if a small slew rate is sufficient, the transistor TEn1x need only be kept turned off. Note that, although in FIG. 34 the transistor TEn1x is connected directly to node D1, a current control transistor may be further inserted between node D1 and the transistor TEn1x. As a result, transition of voltage of node D1 can be made gentle and a sudden current change avoided. In addition, although the above-mentioned example shows an example of connection to node D1, similar advantages can be also be obtained by connecting to other of nodes B1-E1.

Sixteenth Embodiment

Figure 36:
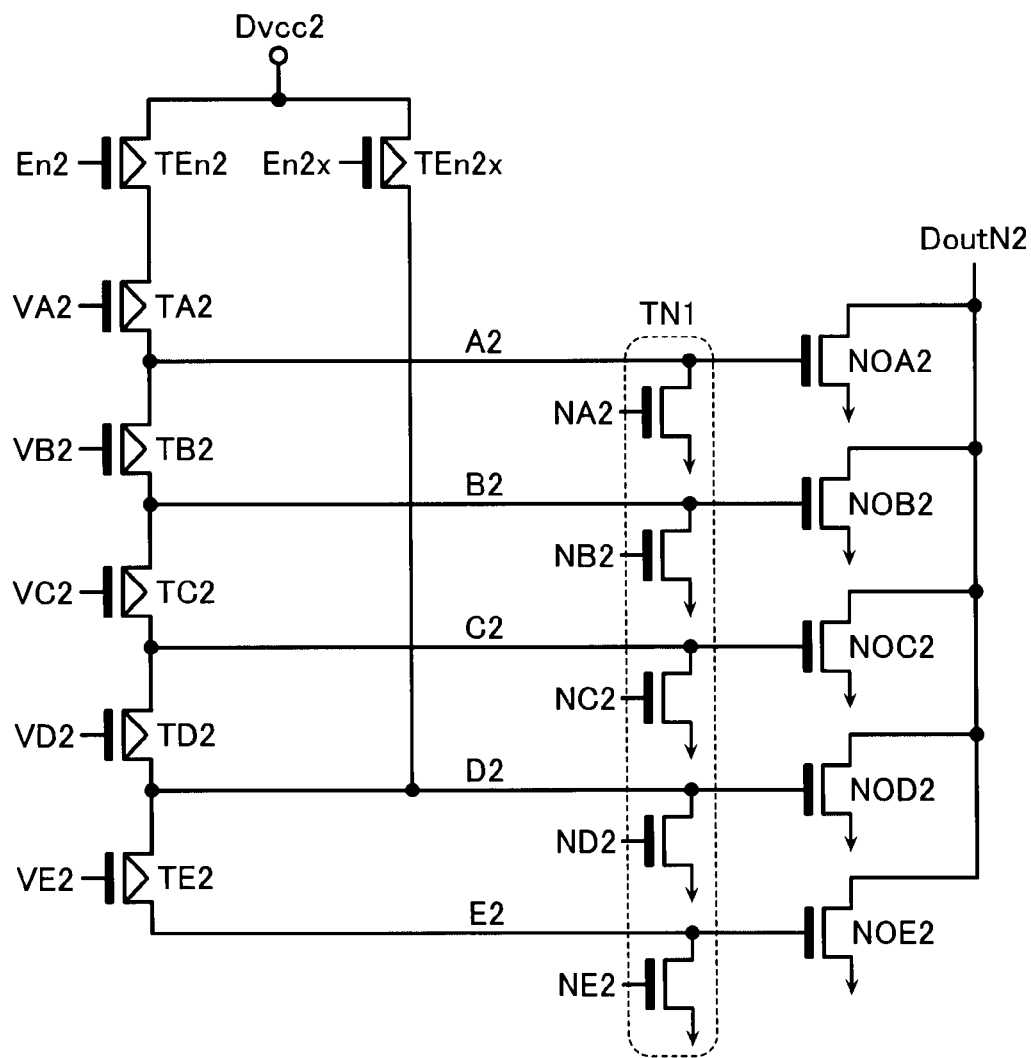
FIG. 36 is an equivalent circuit diagram of a buffer circuit in accordance with a sixteenth embodiment of the present invention.

Next, an output buffer circuit in accordance with a sixteenth embodiment of the present invention is described with reference to FIG. 36. This embodiment has a charge-assisting transistor TEn2x added to the circuit of the second embodiment (FIG. 5). Note that configurative elements identical to those of FIG. 5 are assigned with identical symbols, and detailed descriptions thereof are omitted.

The charge-assisting transistor TEn2x has its drain connected to node D2, its source connected to the power supply terminal Dvcc2, and, furthermore, has its gate applied with a trigger signal En2x which falls to "L" simultaneously with the trigger signal En2.

Figure 37:
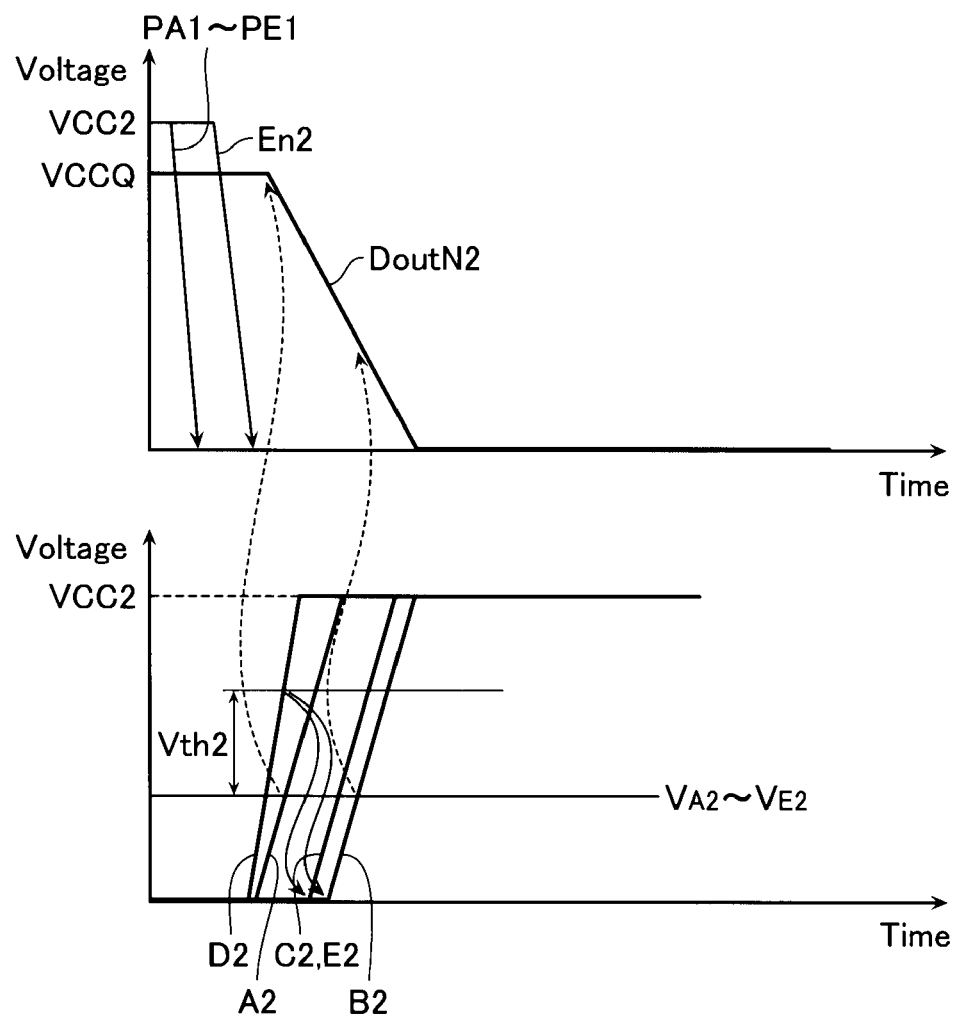
FIG. 37 is a waveform chart showing operation of the buffer circuit in accordance with the sixteenth embodiment of the present invention.

As shown in FIG. 37, this configuration causes node D2 of the nodes A2-E2 to start charging first, followed by node A2 starting charging, and then nodes B2, C2, and E2 starting charging substantially simultaneously. Consequently, the slew rate of the output signal of the output terminal DoutN2 is increased compared with the second embodiment, similarly to the fifteenth embodiment. In addition, although the above-mentioned example shows an example of connection to node D2, similar advantages can be also be obtained by connecting to other of nodes B2-E2.

Seventeenth Embodiment

Next, a PMOS output buffer circuit in accordance with a seventeenth embodiment of the present invention is described with reference to FIG. 38. Note that configurative elements identical to those of FIG. 1 are assigned with identical symbols, and detailed descriptions thereof are omitted.

Figure 38:
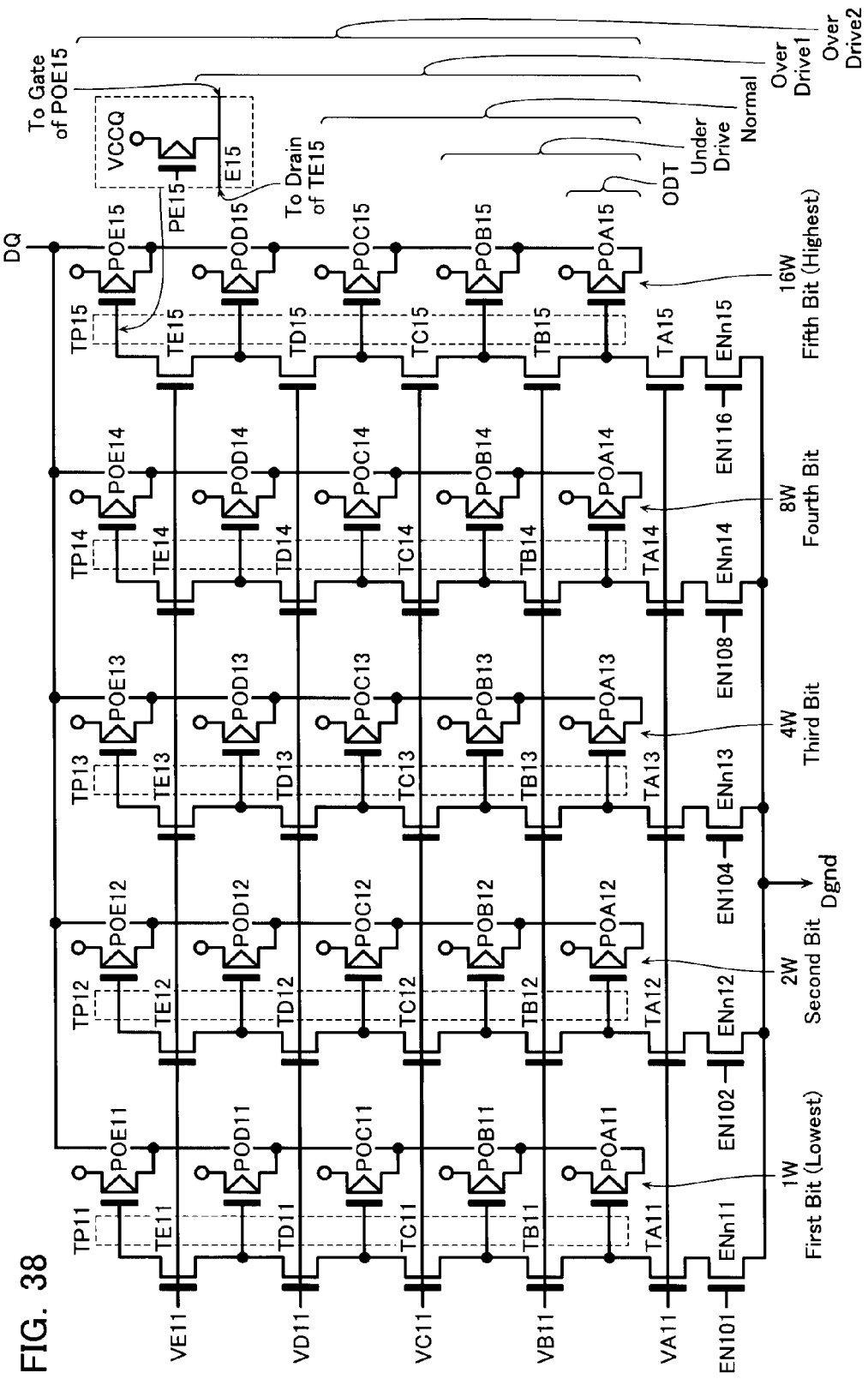
FIG. 38 is an equivalent circuit diagram of a buffer circuit in accordance with a seventeenth embodiment of the present invention.

This PMOS output buffer circuit is configured from a plurality of stages of buffer circuits, similarly to the first embodiment, but has one stage of the buffer circuits configured by a plurality of transistors aligned in a lateral direction (for example, output transistors POA11-15 in FIG. 38). That is, the role of the output transistor POA1 in FIG. 1 is played by the five output transistors POA11-15 in FIG. 38. This seventeenth embodiment is configured to make it possible for only a portion of the five output transistors POA11-POA15 to be operated (trimming), thereby enabling trimming of the transistor size of each stage of the buffer circuits. Trimming allows timing of discharge of the gates of the output transistors in each stage to be adjusted. That is, the present embodiment makes it possible to adjust the slew rate of the output waveform not only by adjustment of the voltage of voltages VA11-VE11, but also by adjustment of transistor size (trimming). The same applies to the second through fifth stages of buffer circuits. The seventeenth embodiment is described in detail below.

In FIG. 38, the output transistors POA11-POE11 are connected in parallel between the power supply voltage terminal and an output terminal DQ. These output transistors POA11-POE11 are controlled by gate control transistors TA11-TE11 and a trigger transistor ENn11. These are configurations corresponding to the gate control transistors TA1-TE1 and trigger transistor ENn1 in FIG. 1.

In addition, output transistors POA12-POE12, output transistors POA13-POE13, output transistors POA14-POE14, and output transistors POA15-POE15 are also similarly connected in parallel between the output voltage terminal and the output terminal DQ. Provided to control gates of these output transistors are gate control transistors TA1x-TE1x and trigger transistors ENn1x (x=2-5).

The trigger transistors ENn1x (x=1-5) are each controlled by a separate trigger signal (EN101, EN102, EN104, EN108, EN116). Moreover, the gate control transistors TA1x (x=1-5) are controlled by a common gate voltage VA11. The other gate control transistors TB1x, TC1x, TD1x, and TE1x are also each controlled by common gate voltages VB11, VC11, VD11, and VE11.

The output transistors POA1x-POE1x aligned in single columns in a longitudinal direction in FIG. 38 are set having an identical transistor size (an identical on-current ratio) for whichever of the columns. This ratio is determined by what degree of difference in the drive capacity is set for each of the drive states (low drive state, normal drive state, first and second high drive states). That is, when the size of transistor POA11 is expressed as $W_{POA11}$ and sizes of other transistors expressed similarly, and when channel lengths of the transistors are constant, the sizes of each of the transistors are set as below.

$$W_{POA11} : W_{POB11} : W_{POC11} : W_{POD11} : W_{POE11} =$$
$$W_{POA12} : W_{POB12} : W_{POC12} : W_{POD12} : W_{POE12} =$$
$$W_{POA13} : W_{POB13} : W_{POC13} : W_{POD13} : W_{POE13} =$$
$$W_{POA14} : W_{POB14} : W_{POC14} : W_{POD14} : W_{POE14} =$$
$$W_{POA15} : W_{POB15} : W_{POC15} : W_{POD15} : W_{POE15}$$

In contrast, the five output transistors POA1x aligned in the lateral direction are set having a transistor size ratio of, for example, 1:2:4:8:16. The other output transistors POB1x, POC1x, POD1x, and POE1x are also similarly set having a transistor size ratio of 1:2:4:8:16 (1 W, 2 W, 4 W, 8 W, 16 W).

Accordingly, trimming of transistor sizes in each stage can be executed by selecting an arbitrary number of these five (five columns of) transistors using the trigger transistors ENn1x. For example, when the buffer circuit in FIG. 38 is employed as a terminating resistor in a separate input buffer circuit not shown, the output transistors POA11-15 are employed as that terminating resistor. At this time, selection can be performed that, for example, operates only certain ones of the output transistors POA11-POA15 or operates all of the output transistors POA11-POA15 by selectively turning on the trigger transistors ENn11-15. This allows trimming of the size of the terminating resistor.

If trimming is performed in one buffer circuit in this way, the result of the trimming can be effectively utilized also in the other buffer circuits. The time for the trimming operation can thus be reduced.

Eighteenth Embodiment

Figure 39:
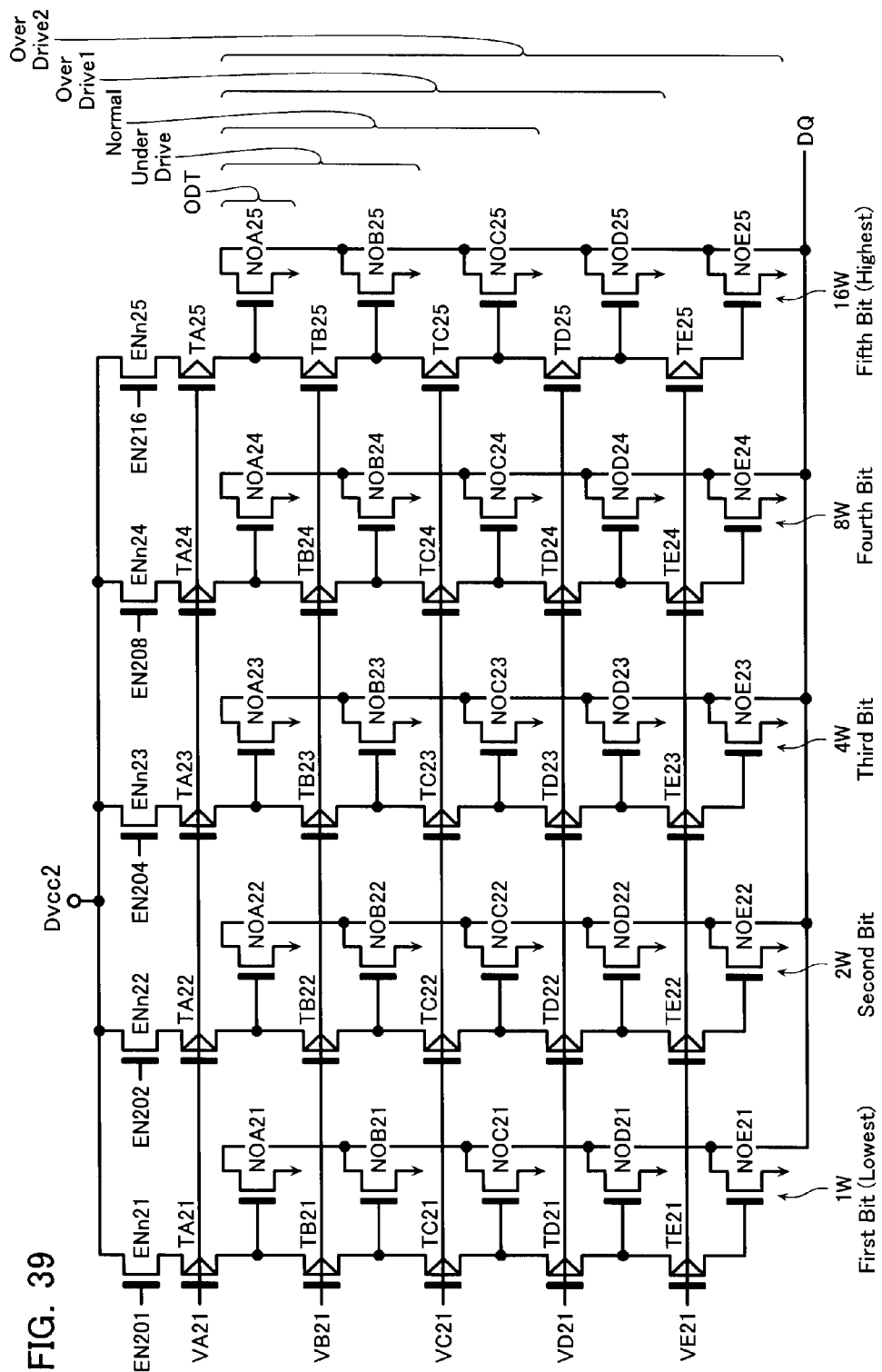
FIG. 39 is an equivalent circuit diagram of a buffer circuit in accordance with an eighteenth embodiment of the present invention.

Next, an NMOS output buffer circuit in accordance with an eighteenth embodiment of the present invention is described with reference to FIG. 39. This embodiment has a configuration similar to that of the seventeenth embodiment realized in an NMOS output buffer. Basic configuration and operation in the eighteenth embodiment are identical to those of the seventeenth embodiment, and detailed descriptions thereof are omitted.

This concludes description of various embodiments of the present invention, but it should be noted that the present invention is not limited to the above-described embodiments, and that various alterations, additions, deletions, modifications, combinations, and so on, are possible within a range not departing from the scope and spirit of the invention. Note that the size of the above-mentioned voltages VA1-VE1, and so on, applied to the gate control transistors may be stored in an intra-chip rewritable memory chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A buffer circuit, comprising:
    a plurality of output transistors connected to form respective current paths in parallel to one another between a first fixed voltage terminal supplying a certain fixed voltage and an output terminal, and configured to turn on to change a voltage of the output terminal; and
    a plurality of gate control transistors connected to form respective current paths between a second fixed voltage terminal supplying a certain fixed voltage and a gate of one of the output transistors or between two of gates of the output transistors, and configured to apply a gate voltage to the gates of the output transistors to control on/off of the output transistors,
    a gate of each of the gate control transistors being applied with a certain voltage, such that when a source of each of the gate control transistors changes from a first potential to a second potential, a potential difference between the gate and the source of each of the gate control transistors attains a threshold voltage or greater, whereby each of the gate control transistors is turned on.

2. The buffer circuit according to claim 1,
    wherein one of the gate control transistors and a trigger transistor are connected in series between the second fixed voltage terminal and a gate of one of the output transistors, and
    wherein the trigger transistor is configured to be applied with a trigger signal at a start of an operation and thereby be turned on.

3. The buffer circuit according to claim 1, further comprising:
    a plurality of pre-charge transistors each provided between the gate of the plurality of output transistors and the first fixed voltage terminal and configured to set the gates of the output transistors to a certain voltage.

4. The buffer circuit according to claim 1, further comprising:
    a constant current circuit configured to supply a constant current to the gate of each of the gate control transistors.

5. The buffer circuit according to claim 1, further comprising:
    a constant current circuit configured to supply a constant current to the gate of each of the gate control transistors;
    transfer gates each connected between the constant current circuit and the gate of each of the gate control transistors and configured to be selectively rendered in a conductive state; and
    a switching circuit configured to selectively supply a first fixed voltage or a second fixed voltage to the gate of each of the gate control transistors.

6. The buffer circuit according to claim 1, further comprising a charge/discharge auxiliary circuit configured to detect a change in voltage of the gates of the output transistors to assist charging or discharging of the gates of the output transistors.

7. The buffer circuit according to claim 1, further comprising:
    a plurality of bypass transistors connected in parallel respectively with the plurality of gate control transistors.

8. The buffer circuit according to claim 1, further comprising a coupling circuit configured to detect a change in voltage of the gate of each of the output transistors and to raise or lower the voltage of the gate of each of the output transistors through capacitance coupling.

9. The buffer circuit according to claim 8,
    wherein the coupling circuit includes an inverter and a capacitor connected in series and is provided between the gate of one of the output transistors and the gate of one of the gate control transistors.

10. The buffer circuit according to claim 1, comprising:
    a first gate control transistor group configured by a plurality of the gate control transistors connected in series; and
    a second gate control transistor group configured by a plurality of the gate control transistors connected in series,
    wherein the first gate control transistor group controls the gate of each of first ones of the output transistors, and
    wherein the second gate control transistor group controls the gate of each of second ones of the output transistors, the second ones of the output transistors being different to the first ones of the output transistors.

11. The buffer circuit according to claim 1, further comprising:
    an auxiliary transistor provided between a certain one of the gates of the output transistors and the second fixed voltage terminal and configured to assist charging or discharging of the certain one of the gates of the output transistors.

12. A buffer circuit, comprising:
    a plurality of output buffer circuits, each of the output buffer circuits including a first output transistor and a second output transistor, the first output transistor being connected to form a current path between a first fixed voltage terminal supplying a certain fixed voltage and an output terminal and configured to turn on to change a voltage of the output terminal, and the second output transistor being connected to form a current path between a second fixed voltage terminal supplying a certain fixed voltage and the output terminal and configured to turn on to change a voltage of the output terminal;

a plurality of first gate control transistors connected to form respective current paths between a third fixed voltage terminal supplying a certain fixed voltage and a gate of one of the first output transistors or between two of gates of the first output transistors, and configured to apply a gate voltage to the gates of the first output transistors to control on/off of the first output transistors; and a plurality of second gate control transistors connected to form respective current paths between a fourth fixed voltage terminal supplying a certain fixed voltage and a gate of one of the second output transistors or between two of gates of the second output transistors, and configured to apply a gate voltage to the gates of the second output transistors to control on/off of the second output transistors, a gate of each of the first gate control transistors being applied with a certain voltage, such that when a source of each of the first gate control transistors changes from a first potential to a second potential, a potential difference between the gate and the source of each of the first gate control transistors attains a threshold voltage or greater, whereby each of the first gate control transistors is turned on, and a gate of each of the second gate control transistors being applied with a certain voltage, such that when a source of each of the second gate control transistors changes from a third potential to a fourth potential, a potential difference between the gate and the source of each of the second gate control transistors attains a threshold voltage or greater, whereby each of the second gate control transistors is turned on.

13. The buffer circuit according to claim 12, further comprising:

a plurality of first pre-charge transistors each provided between a gate of the plurality of first output transistors and the first fixed voltage terminal and configured to set the gates of the first output transistors to a certain voltage; and a plurality of second pre-charge transistors each provided between a gate of the plurality of second output transistors and the second fixed voltage terminal and configured to set the gates of the second output transistors to a certain voltage.

14. The buffer circuit according to claim 12, wherein one of the first gate control transistors and a first trigger transistor are connected in series between the third fixed voltage terminal and the gate of one of the first output transistors, wherein one of the second gate control transistors and a second trigger transistor are connected in series between the fourth fixed voltage terminal and the gate of one of the second output transistors, and wherein the first trigger transistor and the second trigger transistor are configured to be applied with a trigger signal at a start of an operation and thereby be turned on.

15. The buffer circuit according to claim 12, further comprising:

a first constant current circuit configured to supply a constant current to the gate of each of the first gate control transistors;

a second constant current circuit configured to supply a constant current to the gate of each of the second gate control transistors;

a transfer gate connected between the first constant current circuit and second constant current circuit and the gates of each of the first gate control transistors and second gate control transistors and configured to be selectively rendered in a conductive state;

a switching circuit configured to selectively supply a first fixed voltage or a second fixed voltage to the gate of each of the first gate control transistors and second gate control transistors; and a plurality of equalize transistors, each connected between a gate of any one of the first gate control transistors and a gate of any one of the second gate control transistors.

16. A buffer circuit, comprising:

a plurality of output buffer circuits, each of the output buffer circuits including a transistor configured to operate in response to a change in an input signal and thereby change a voltage of an output terminal, each of the output buffer circuits comprising:

a plurality of stages of output transistors connected to form respective current paths in parallel to one another between a first fixed voltage terminal supplying a certain fixed voltage and an output terminal, each of the output transistors being configured to turn on to change a voltage of the output terminal; and a plurality of stages of gate control transistors connected to form respective current paths between a second fixed voltage terminal supplying a certain fixed voltage and a gate of one of the output transistors or between two of gates of the output transistors, and configured to apply a gate voltage to the gates of the output transistors to control on/off of the output transistors, gates of the gate control transistors in an identical stage of the plurality of output buffer circuits being commonly connected, and the gate of each of the gate control transistors being applied with a certain voltage, such that when a source of each of the gate control transistors changes from a first potential to a second potential, a potential difference between the gate and the source of each of the gate control transistors attains a threshold voltage or greater, whereby each of the gate control transistors is turned on.

17. The buffer circuit according to claim 16, wherein a transistor size ratio of each stage of the output transistors in one of the output buffer circuits is formed to be identical for each of the output buffer circuits.

18. The buffer circuit according to claim 16, wherein the output transistors in an identical stage of the plurality of output buffer circuits are formed having a certain transistor size ratio.

19. The buffer circuit according to claim 16, wherein one of the gate control transistors and a trigger transistor are connected in series between the second fixed voltage terminal and the gate on one of the output transistors, and wherein the trigger transistor is configured to be applied with a trigger signal at a start of an operation and thereby be turned on.

20. The buffer circuit according to claim 12, further comprising:

a transmission path; and a input buffer circuit, wherein the output terminal of the output buffer circuit is connected to the transmission path, and wherein the output terminal of the output buffer circuit is connected to the input buffer circuit.

* * * * *